United States Patent [19]

Maltby et al.

[11] Patent Number: 5,777,550
[45] Date of Patent: Jul. 7, 1998

[54] HIGH RELIABILITY INSTRUMENT SYSTEM

[75] Inventors: Frederick L. Maltby, Jenkintown; Glen L. Mitchell, Dresher, both of Pa.; Mort Gorowitz, Syosset, N.Y.

[73] Assignee: Drexelbrook Controls, Inc., Horsham, Pa.

[21] Appl. No.: 778,587

[22] Filed: Jan. 3, 1997

Related U.S. Application Data

[63] Continuation of Ser. No. 286,482, Aug. 3, 1994, abandoned.
[51] Int. Cl.$^6$ .......................... G08B 29/00; H04R 17/00
[52] U.S. Cl. .................. 340/514; 340/508; 340/507; 340/621; 73/304 R; 324/727; 367/13; 367/166; 367/908
[58] Field of Search ..................... 340/514, 515, 340/516, 450, 618, 621, 620, 507, 508; 73/290 R, 304 R; 324/523, 727; 367/13, 908, 157, 166

[56] References Cited

U.S. PATENT DOCUMENTS

| | | | |
|---|---|---|---|
| 3,594,788 | 7/1971 | Seelig | 340/515 |
| 4,253,091 | 2/1981 | Frydman | 340/506 |
| 4,363,030 | 12/1982 | Maltby et al. | 340/507 |
| 4,962,368 | 10/1990 | Dobrzanski et al. | 340/514 |
| 5,191,795 | 3/1993 | Fellingham et al. | 340/621 |
| 5,239,459 | 8/1993 | Hunt et al. | 340/514 |

*Primary Examiner*—Donnie L. Crosland
*Attorney, Agent, or Firm*—Reed Smith Shaw & McClay LLP

[57] ABSTRACT

A high reliability instrument system includes means for applying a test condition to the instrument and for determining whether the instrument properly responds to the test condition, and means for inhibiting the generation of an instrument output in response to such testing. This provides verification that most of the instrument system components, but not the system output, are properly functioning. The system further includes means for overriding the output-inhibiting function when it is desired to test the entire instrument system including the system output. The instrument system may include a gap-type ultrasonic instrument, with the test condition comprising a pulse applied to one crystal, the effects of which are detected at the other crystal to determine sensor integrity. The system is preferably configured as a two-wire on-off instrument system, in which application of the test condition at a transmitter is controlled by signals applied to the two-wire signal loop at a remote receiver. The system may be implemented as a quasi-redundant system having radio frequency instrument and an ultrasonic instrument disposed to monitor the same condition, in which both instruments may be connected to a single type of receiver and tested in response to the same type of signal generated by such receiver.

6 Claims, 22 Drawing Sheets

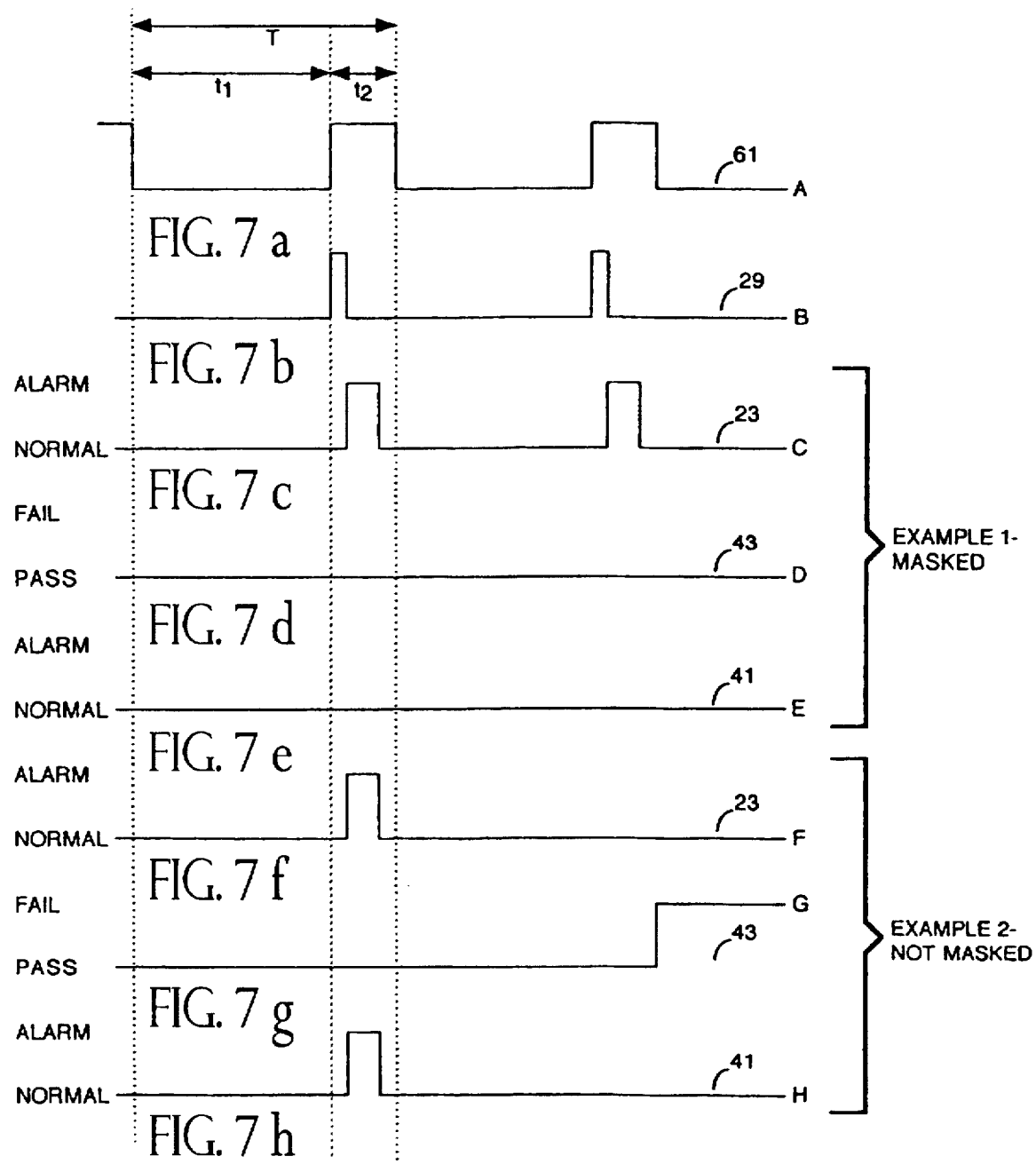

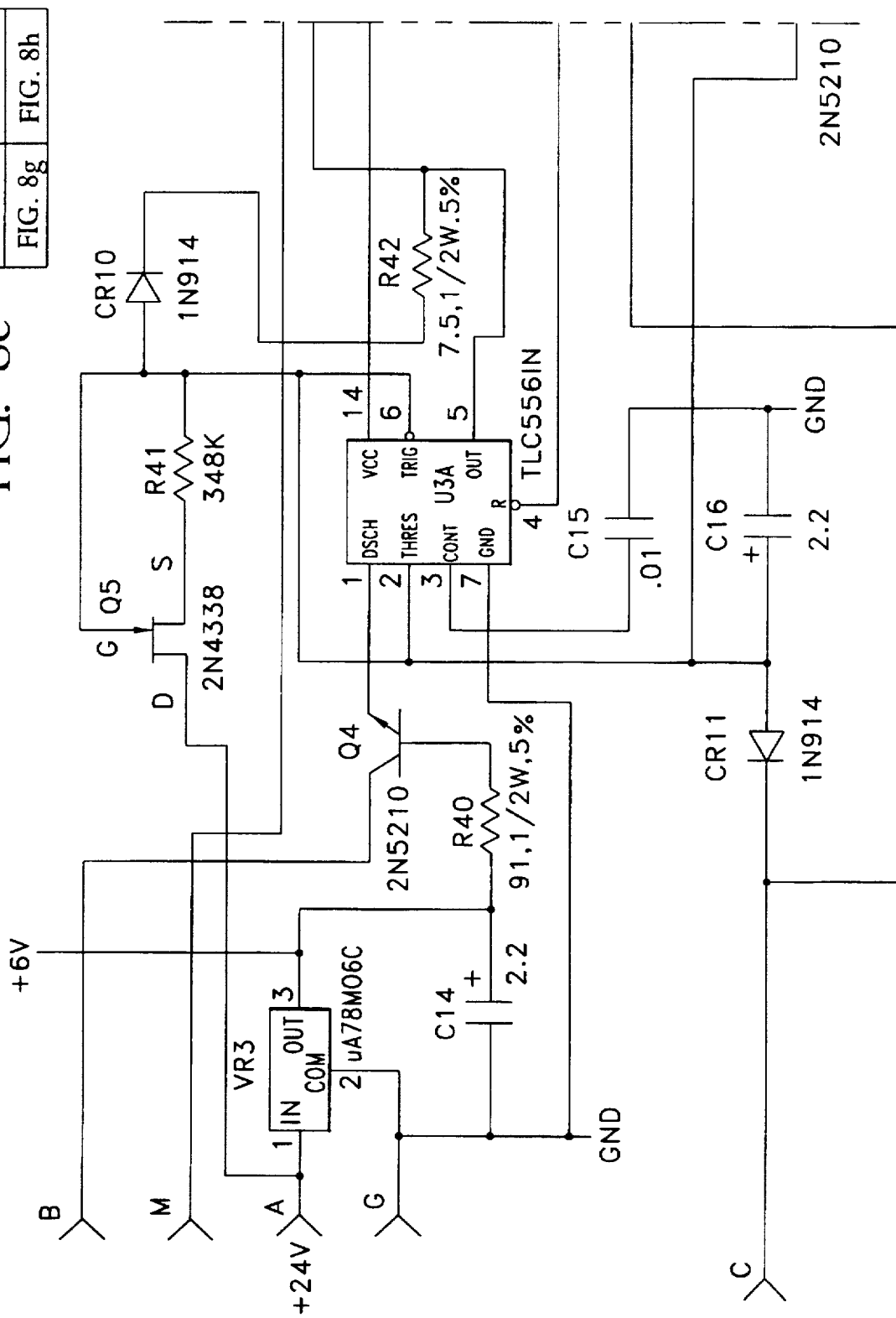

HIGH RELIABILITY INSTRUMENT SYSTEM

This is a continuation of application(s) Ser. No. 08/286,482 filed on Aug. 3, 1994 now abandoned.

FIELD OF THE INVENTION

This invention relates to industrial instrumentation systems, such as systems for monitoring materials which are used or handled in industrial processes. More particularly, this invention relates to instrumentation systems in which the operability of the system may be verified. This invention also relates to such systems in which reliability is enhanced by use of quasi-redundant instruments, i.e. a plurality of instruments which are deployed to monitor the same condition (such as the level of material in a vessel) but which are differently configured, so that failure modes to which one instrument is subject are unlikely to also affect another instrument measuring the same condition. Still more particularly, this invention relates to high reliability ultrasonic and radio frequency material monitoring instrument systems.

BACKGROUND OF THE INVENTION

There are many industrial instrumentation applications in which reliability is considered to be of great importance. For instance, a spill resulting from overfilling a vessel with a toxic or otherwise dangerous material can result in severe personal injury and property loss. Attitudes have changed, and the public is no longer complacent about dangerous spills. Persons responsible for spills have been subjected to substantial civil and criminal penalties. It is desirable for the material monitoring instrument systems used with such vessels to be as reliable as possible. Such systems usually include a high level alarm, which is intended to detect an abnormally high material level and generate an alarm output, to enable control action to be taken before the abnormal condition worsens to the point of overfilling the vessel and spilling the material. The instrument systems used in these and many similar applications are "on-off" or bistable systems, which provide an output having two possible states, a "normal" state and an "alarm" state, and it is these systems to which the present invention is principally directed.

An inherent difficulty in many measuring situations is that the condition to be detected—e.g. an incipient overfill and spill—is an abnormal condition which is expected to occur rarely, if at all, if the industrial process is operating correctly. At a time when the process is operating correctly and the abnormal condition does not exist, the question is: if the abnormal condition were to occur in the immediate future, would the instrument system correctly detect and respond to it? Because of the hypothetical nature of the question, the answer is necessarily indeterminate and probabilistic. However, to a process operator, the answer may be of critical practical importance. If there is a high probability that the instrument would properly respond, it may be considered reliable; in practical terms, the process operator can comfortably rely on an instrument output indicating a normal material condition as correctly representing the actual material conditions, and can rely on the instrument to provide an alarm output if abnormal material conditions occur.

High reliability can be provided by "front end" measures in the design of an instrument system, using a system structure and components that are intrinsically reliable and unlikely to fail in the anticipated measuring environment. The reliability that is afforded by such "front end" measures is essentially a statistical reliability, i.e., a probability that a randomly selected instrument system of a particular type will fail. That a particular type or model of instrument system is highly reliable in this sense may be of little comfort to the operator of a process who may be held criminally liable in the event of a spill; for instance, the fact that a particular instrument system model is so reliable that it has only a one-in-a-million chance of failure is irrelevant to the process operator if his is the one instrument in a million which has failed. To the process operator, it may be extremely important to be able to verify at a particular time that the particular instrument system monitoring a vessel for which he is responsible is working.

Moreover, factors other than instrument failure per se may be far more pertinent to the ability of the instrument system to detect the conditions it is intended to. For instance, miscalibration or calibration drift can render an instrument incapable of responding to an overfill condition despite the fact that the instrument is "working" in the general sense. Thus, it may be extremely desirable for the operator to be able to verify at any time that his particular instrument is properly responsive to the particular abnormal conditions it is intended to detect. Such a capability would enable the process operator to assure and reassure himself of the reliability of his particular instrument system in responding to the material conditions of interest.

A variety of techniques have been employed in an effort to provide instrument systems which are reliable by design. Perhaps the simplest is what is referred to as "fail safe", in which the system is designed so that the alarm state of the output signal is made to correspond with the power-off state of the output device. For example, in a high level alarm with a relay output, the de-energized state of the relay would be used to provide the alarm output state, on the reasoning that (1) power loss to the instrument is a common failure mode, and (2) in the event of such failure it is preferable for the output to go to the state corresponding to an alarm. Obviously failures other than power loss can occur, including types of failures which would prevent an instrument from generating an alarm output.

Another instrument system structure providing increased reliability is disclosed in U.S. Pat. No. 4,363,030 to Maltby et al. entitled "Fail-Safe Instrument System" and assigned to the assignee of this invention. The system disclosed in that patent is a two-wire system, i.e. a system having a transmitter in one location and a receiver in another location interconnected by a pair of signal wires, in which the signal wires both convey operating power from the receiver to the transmitter and convey transmitter output signals to the receiver. The system structure of this patent provides improved reliability by restricting the range of transmitted signals which are interpreted as valid signals; departure of the transmitted signal from the valid range is detected and interpreted as a system failure, and appropriate responsive action may be taken. The system includes a pair of outputs, including a "main" output which is responsive to the material condition of interest if the system is working properly, and a "validity" output which indicates whether an out-of-valid-range type failure has occurred.

Efforts to improve the reliability of instrument systems through system structure and design have also included use of redundant instruments. For instance, the above-described patent to Maltby et al. discloses providing redundant transmitters, only one of which is active at a given time; upon detection of an invalid signal from one transmitter, the other is made active. In such a system which includes a plurality of instruments, all of which must fail to cause a system failure, the probability of system failure is the product of the probability of failure of the constituent instruments. For example, if two nominally identical redundant instruments are used, each of which has one chance in a thousand of failing during a particular time interval, the probability of failure of the system is one chance in a million—so long as the causes of failure affect each instrument independently. A simple example where this is not the case is a system where all instruments are powered from the same power source; failure of the power source will cause failure of all of the instruments, and redundancy does not improve the system reliability at all with respect to that failure mode. Similar but subtler problems exist whenever the system components include nominally identical redundant instruments.

The overall system reliability may be improved by using "quasi-redundant" or functionally redundant instruments, i.e. instruments which respond to the same physical condition of interest (such as material level) but which are nominally not identical. Such quasi-redundant instruments are preferably substantially or entirely different from each other, including in the technology or principle utilized to measure the condition of interest, and thereby can remain operable over a wide range of conditions which would cause failure of a redundant system composed of only a single instrument type. A variety of level measuring instrumentation technologies exist which are suitable for overfill protection, including radio frequency admittance monitoring instruments and ultrasonic instruments. However, difficulties can arise in integrating disparate instrument types into a common, quasi-redundant system.

Other efforts to improve the reliability of instrument systems have included provisions for testing the operability of the system or portions thereof. Testing systems are known which apply a test condition to an instrument so that the instrument response to the test condition may be detected. For instance, U.S. Pat. No. 4,412,450 to Franz et al. describes systems comprising a radio frequency admittance-monitoring transmitter in one location and a receiver in another location which supplies power to and receives a signal from the transmitter over a pair of signal wires. In the Franz systems, a receiver circuit having a timer periodically open-circuits the signal wires, and a transmitter circuit detects such periodic signals and responds to them by disconnecting the transmitter from the material-sensing probe to provide a synthetic signal. The receiver is intended to detect the response of the transmitter to the synthetic signal, and if the response is appropriate, determine that the transmitter is operational. The Franz et al. systems have a number of drawbacks, a principal one being that they are subject to failures which could remain undetected indefinitely while the process operator maintains a false sense of security based on the presence of a purported self-checking feature.

Use of a timer to periodically initiate instrument self-checking can cause serious problems. For instance, in an overfill-protection system, an alarm output from the instrument may result in drastic responses including evacuation of plant personnel and others from the vicinity of the vessel. In most circumstances a periodic alarm output caused by the testing function would be highly undesirable. However, it is desirable to be able to test as much of an instrument system as possible, including its ability to generate an alarm output. Moreover, with certain instrument types such as ultrasonic high level alarms, there has been difficulty in providing a means to adequately test the sensor and other components of the system. U.S. Pat. No. 4,299,114 to Silvermetz et al. proposes a means for checking sensor integrity in an ultrasonic instrument, but that system does not test the same instrument circuit under the same instrument conditions as will exist during measurement. It therefore does not provide assurance that if the system is tested and passes, it will properly respond to actual material alarm conditions. Other systems for testing ultrasonic instruments have included additional sets of crystals in the sensor for testing purposes, but such systems may be costly and also fail to ensure that if a test is passed the system will respond properly to material.

SUMMARY OF THE INVENTION

It is therefore a general object of the invention to provide an instrument system having improved reliability.

It is a more specific object of the invention to provide an instrument system in which the operability of the system may be verified.

It is another object of the invention to provide an instrument system in which the ability of the system to respond to particular material conditions of interest may be verified.

It is another object of the invention to provide such a high reliability instrument system which is suitable for monitoring the level of material in a vessel to prevent overfilling and spilling of the material.

It is another object of the invention to provide such a high reliability instrument system utilizing radio frequency and/or acoustic type level measuring instruments; and in connection therewith, it is an object of the invention to provide an acoustic instrument in which the operability of substantially the entire instrument may be checked.

It is another object of the invention to provide such a high reliability instrument system of the two-wire type, particularly of a type using standard signals in the two-wire signal transmission line.

It is another object of the invention to provide means for testing instrument operability which may be easily added to existing instrument systems, and which does not adversely affect the normal operation of the instrument system or impair its reliability.

In accordance with the foregoing objects, in a first aspect of the present invention an instrument system includes means for temporarily imposing a test condition on the instrument and determining whether the instrument system properly responds to the test condition; during the time intervals when such testing is occurring, the system output is "masked" from the effects of the test condition and is maintained in its pre-test state, so that the testing process does not cause the effects that an actual alarm material condition is intended to cause. In a preferred embodiment, the system of the invention includes means for automatically periodically imposing the test condition and for masking the system output during such automatic testing, as well as means for overriding the "masking" function so that, when desired, the overall operation of the system including the periodic self-checking function may be demonstrated and verified.

In another aspect of the invention, the test condition which is imposed during testing is selected so that if the instrument properly responds to the test condition, it would properly respond to the material condition of interest. In this way, the verification process includes verification of proper calibration and the like.

In another aspect of the invention, a quasi-redundant two wire instrument system is provided which includes self-checking features as described above.

In another aspect of the invention, an acoustic instrument is provided which is suitable for use in such quasi-redundant systems; the self-checking features are also useful in instrument systems which are not two-wire or not redundant.

The preferred embodiment of the invention is in a two-wire instrument system having a transmitter in one location and a receiver in another location interconnected by a pair of signal wires, in which the transmitter is a bistable or "on-off" device that produces an output current in one of two discrete ranges in response to signals from a material-responsive sensor, and the receiver produces a bistable output in accordance with the current in the signal wires. A test signal imposed on the signal wires by the receiver is detected by the instrument to cause application of the test condition. The instrument may be implemented as a radio frequency admittance instrument or as an ultrasonic instrument, and a particularly preferred acoustic instrument which may be tested for operability is disclosed herein.

These and other objects and features of the present invention will be understood with reference to the following specifications and claims and the drawings.

BRIEF DESCRIPTION OF THE DRAWINGS

FIG. 7 is a timing diagram illustrating operation of a receiver using a controller as in FIG. 5.

DETAILED DESCRIPTION OF THE INVENTION

Figure 1:
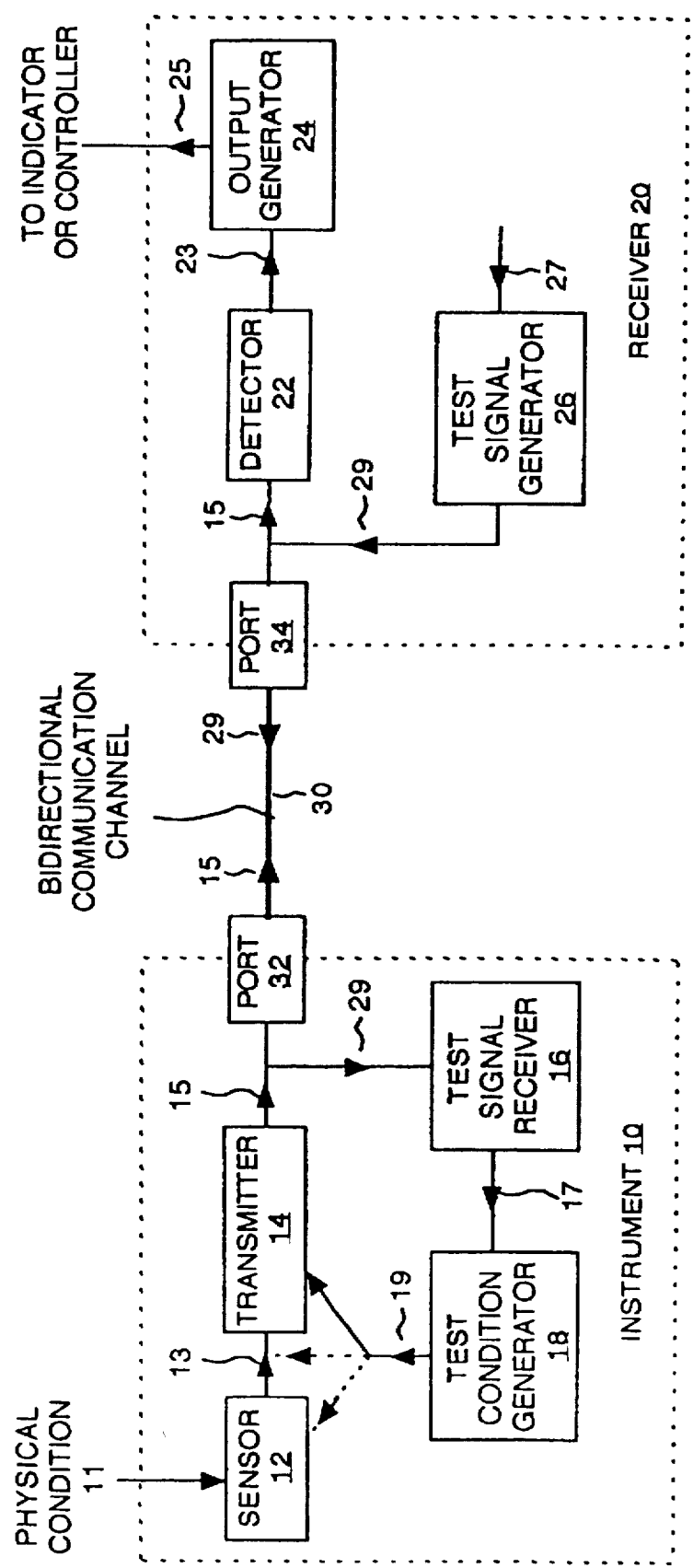
FIG. 1 is a block diagram illustrating the basic functional elements of a system which may be tested for operability.

FIG. 1 is a block diagram illustrating the basic functional elements of an instrument system which may be tested to determine operability. The system includes an instrument 10 and a receiver 20 which are interconnected by a bi-directional communication channel 30. The instrument 10 includes a sensor 12 that produces a sensor output signal 13 that is responsive to some physical condition 11 to which the sensor is exposed. For example, sensor 12 may be an admittance probe that produces an admittance-related electrical output signal that is responsive to the level of material in a vessel. A transmitter 14, coupled to the sensor 12 and to the communication channel 30 at a port 32, receives the sensor output signal 13 and produces a responsive transmitter output signal 15 for transmission over communication channel 30 to the receiver 20. Sensor 12 and transmitter 14 comprise the measuring portion of instrument 10. Communication channel 30 permits the instrument 10 to be located remote from receiver 20; generally it is desirable to locate an instrument 10 near the physical condition 11 which is to be monitored, and to locate the receiver 20 in a convenient place to monitor the instrument output signals and to implement appropriate indication or control functions. Receiver 20 includes a signal processing portion including a detector 22 that is coupled to an output generator 24. Detector 22 is coupled to communication channel 30 at a port 34 to receive transmitter output signals 15, and produces detector output signals 23 in accordance with the signals received from communication channel 30. Output generator 24 generates a receiver output signal 25, as the principal system output, which may be supplied to indicators or control devices. The receiver output signal 25 is generated in accordance with the detector output signal 23.

In order to test the operability of the foregoing system components, testing apparatus is included in the instrument 10 and in the receiver 20. The receiver testing portion includes a test signal generator 26. In response to a test initiation signal 27, indicating that a test should be performed, test signal generator 26 produces a test signal 29 which is coupled to port 34 and thus to communication channel 30. Instrument 10 includes a test signal receiver 16, which is coupled to the port 32 and thus to the communication channel 30. Upon detection of a test signal 29 from the communication channel 30, test signal receiver 16 provides a control signal 17 to a test condition generator 18, which in response generates a test condition 19. The test condition 19 is applied to the measuring portion of the instrument, and is selected to produce a detectable change in transmitter output signal 15. Thus, the system of FIG. 1 may be tested by applying a test initiation signal 27; if receiver 20 produces an output 25 which is appropriate for the test condition and occurs shortly after the test initiation signal, it may be assumed that the system is functioning properly.

The term "test condition", while broad, is intended to reflect that a wide variety of conditions may be imposed on an instrument in order to determine its operability. The test condition 19 may be imposed on the transmitter 14, as indicated by the solid arrow, or upon the sensor 12 or sensor-transmitter interconnection, as indicated by the dotted arrows. The test condition 19 may be a signal which simulates those signals which would occur under particular conditions at the location where the test condition is applied, or it may be a signal which is unrelated to normally occurring signals in the instrument but which will induce a particular response if the instrument is operating properly.

Figure 2:
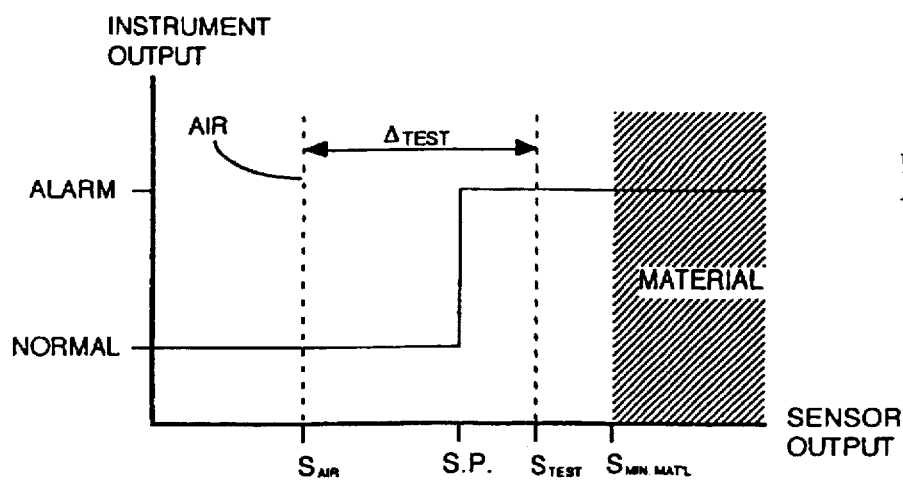
FIG. 2 illustrates a transfer function of a transmitter which may be used in the system of the invention.

The invention is particularly useful with bistable or "on-off" type instruments. The transfer function of such an instrument is shown in FIG. 2, in which the instrument output is plotted against the sensor output. The instrument output signal has two stable states, which are usually considered to be a "normal" state and an "alarm" state. The instrument output signal changes from one state to the other state when its input signal crosses a setpoint value indicated as "S.P.". For instance, in a high level alarm instrument used for overfill protection, the normal instrument output state corresponds to a material level below a setpoint and the alarm output state corresponds to a material level above the setpoint.

FIG. 2 also illustrates the preferred method for establishing the setpoint of the instrument and for establishing the magnitude of the test condition which is imposed by test condition generator 18. A high level alarm, such as a radio frequency admittance transmitter with an immersion sensor, will typically have a first sensor output signal level $S_{AIR}$ when the material level is low and the probe is surrounded by air. When the material level rises above the level at which the sensor is disposed in the vessel, the sensor output is a higher signal level which may assume a range of values indicated by crosshatching depending on the characteristics of the particular material in the vessel, but has some minimum value $S_{MIN,MATL}$ which can occur. The transmitter setpoint is desirably set between the sensor output signal level expected in air and the minimum sensor output signal level which is expected to occur due to high material level, as indicated in FIG. 2. When the transmitter is so calibrated, it will provide an alarm output signal state when a high level condition exists, regardless of the material.

FIG. 2 also illustrates the preferred magnitude of effect of the test condition signal 19 which is provided by test condition generator 18. As shown, the test condition signal provides a change $\Delta_{TEST}$ which is greater than that required to exceed the setpoint but less than the minimum signal change provided by material covering the sensor. Establishing the test condition effect at this magnitude ensures that if the instrument output goes to the alarm state when the test condition is applied, it will go to the alarm state when material covers the sensor. Such settings provide verification during testing that the instrument calibration is proper. It should be noted that this system for calibration and testing ensures that significant changes in instrument calibration will reveal themselves. If the instrument setpoint drifts to a value below the air sensor output signal level, then the instrument will generate an alarm output signal. If the instrument setpoint drifts above the signal level occurring when the test condition signal is applied, then the instrument will fail to go to the alarm state during testing. The operator's attention will be drawn to the problem in either event.

The system of the invention is also particularly useful with "two-wire" instruments, in which the instrument receives its operating power from and supplies its output signal to a single pair of signal wires which comprise the communication channel 30. In such a system, the ports 32 and 34 are pairs of terminals at which connections to the signal wires are made. Particularly preferred two-wire systems are DC current signaling systems in which the instrument output is a DC current generally in the range of about 4 mA to 20 mA. A two-wire instrument of this type may easily be made intrinsically safe and may easily be interfaced with a wide variety of commercially available power supply and receiver equipment designed to operate with such instruments.

Thus, in a preferred system, instrument 10 includes a transmitter 14 which switches from a relatively high current normal state output signal (e.g. in the range of 12–20 mA) to a relatively low current alarm state output signal (e.g. in the range of 4–12 mA) when the sensor output signal crosses the setpoint. The receiver 20 includes a detector 22 which responds to the current in the signal wires and generates, as its detector output signal 23, a bistable or logic signal which changes state as the detected current rises above or falls below a current threshold (e.g. 12 mA). The output generator 24 converts the detector output signal 23 to a form which is suitable for use by external indicating or controlling devices; for instance, output generator 24 may comprise a relay which is energized to provide a normal condition receiver output signal 25 and which is de-energized to provide an alarm condition receiver output signal 25. The test signal generator 28 may provide a brief voltage pulse between the signal wires as a test signal 29. The test signal receiver 16 detects such a brief pulse and in response provides a control signal 17 to the test condition generator 19. The control signal causes the generator 18 to impose the test condition 19 for a period of time extending after the test signal pulse has died away and exceeding the response time of the instrument 10. The test condition 19 which is imposed is sufficient to cause the transmitter 14 to change its output signal 15 from one current state to the other. This change in transmitter output signal current 15 is detected by the detector 22 and results in a change in the state of receiver output signal 25. A test initiating signal 27 may be provided by a timer so that it occurs automatically and repeatedly, or it may be provided manually such as by actuation of a push-button.

Figure 3:
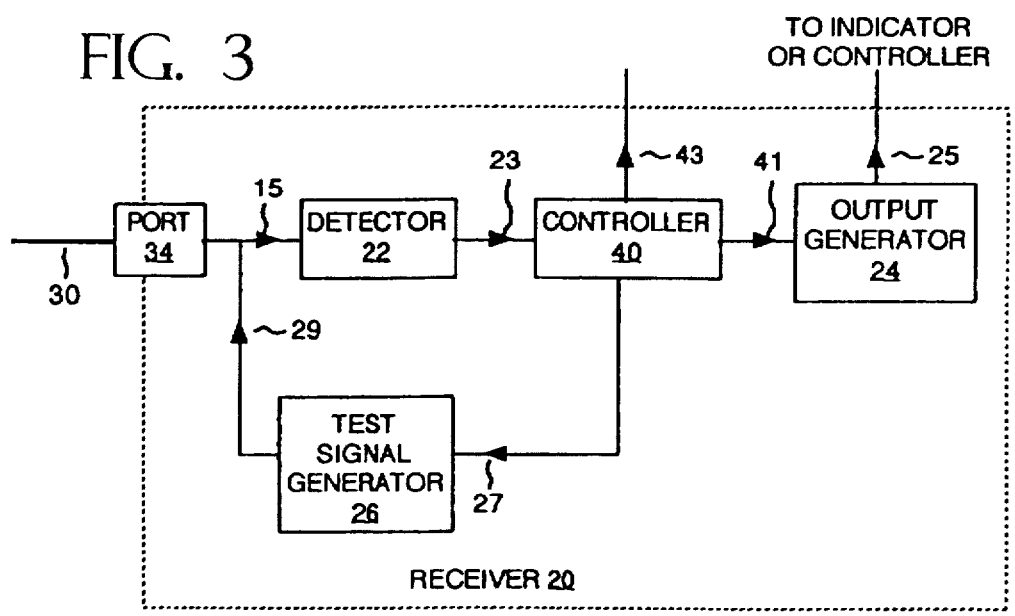
FIG. 3 is a block diagram of a receiver which may be used in the system of the invention.

In many circumstances, it is undesirable to have the receiver output signal 25 go to its alarm state whenever a test is made. The alarm condition signal may result in drastic emergency responses that cannot be tolerated every time a test is desired. FIG. 3 illustrates a modification to the receiver of FIG. 1 which is useful in such circumstances. In the receiver of FIG. 3, the detector output signal 23 does not directly control the output generator 24. Instead, the detector output signal 23 is supplied to a controller 40 which provides a controller output signal 41 to control the operation of output generator 24. Controller 40 is also coupled to test signal generator 26 so that their operations may be coordinated. As shown in FIG. 3, the test initiation signal 27 is supplied from controller 40 to test signal generator 26, but all that is necessary is that both functional blocks have access to the test initiation signal so that their operation may be synchronized.

Figure 4:
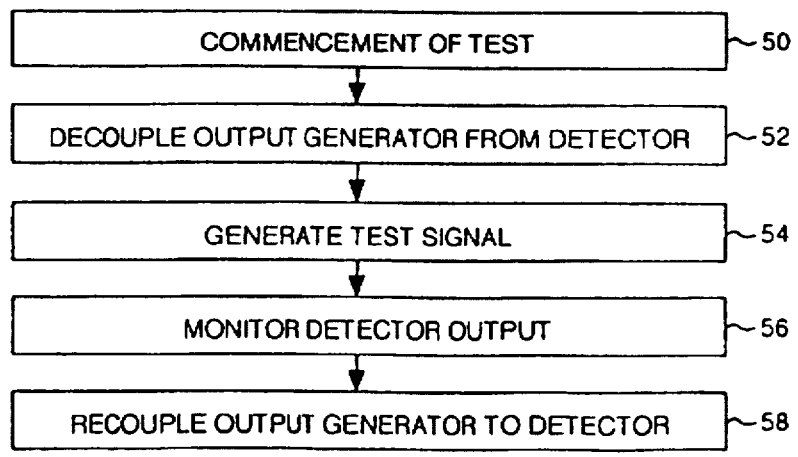
FIG. 4 is a flow diagram illustrating the operation of the receiver of FIG. 3.

Basic operation of the system of FIG. 3 is illustrated in the flow diagram of FIG. 4. A test operation is indicated as commencing in step 50. In step 52 the controller 40 decouples its output 41 from the detector output 23. Thus, during the testing procedure, the receiver output signal 25 is maintained in its pretest state and is prevented from responding to the detector output signal changes which will occur if the test is successful. A test signal is generated in step 54 and supplied to communication channel 30. In step 56, the detector output signal 23 is monitored to determine whether the system has passed the test. If the system is operational, an appropriate change in detector output signal 23 will occur within the system response time after the occurrence of the test signal. Desirably, controller 40 generates a test status output signal 43 which indicates whether a test is being performed and/or whether a test has been passed. Controller 40 may also control the state of the output signal 25 as a part of monitoring step 56, such as by causing an alarm output signal upon a test failure. In step 58 the controller recouples the detector output signal 23 to the output generator 24, to conclude the test process. Thereafter, until the commencement of another test, the controller permits the receiver output to be responsive to detected instrument signals.

It should be understood that the specific sequence of steps in FIG. 4 is illustrative only, and that the indicated steps need not be performed as separate steps and in the order shown. The basic function is to inhibit automatically generating an alarm output in response to a test. In practice, the test-commencement event may be the occurrence of a test initiating signal, which signal simultaneously causes the generation of a test signal and the decoupling of the output generator from the detector.

Existing instrument testing systems may be subject to several drawbacks in terms of providing system reliability.

An instrument testing system which requires a manual input to perform a test enables an operator to test the system whenever desired; however, after a test has been made, the system can fail without the operator knowing it. Systems which include a timer to periodically automatically initiate a test have the theoretical advantage of providing automatic testing as frequently as desired, but in practice would be subject to drawbacks. For instance, as mentioned above, in many cases it is undesirable or impossible as a practical matter to permit a successfully completed test to generate an alarm condition receiver output signal. In such cases, the test procedure may include disabling the receiver output as described above with respect to FIG. 4, and the system may include circuitry which automatically monitors the testing operation and is intended to warn the operator of a failure during the automatic testing. In such a system, the automatic testing system may be analogized to a watchman whose job is to monitor the measuring instrumentation and to report if there is a problem. The drawback of such a system is that if the operator does not receive a report of a problem from the "watchman", the operator does not know whether this is because the "watchman" is doing his job and has correctly determined that there is no problem, or because the "watchman" has become incapacitated and cannot report the existence of a problem. Moreover, even if the "watchman" is working properly during periodic testing, if the system output is decoupled during each test then the entire instrument system is not being tested. A problem or failure in the output generator, or in the indicating or control devices it is intended to drive, or in the coupling between them, would prevent the system from properly responding to a real alarm condition but would not be revealed during the testing.

Figure 5:
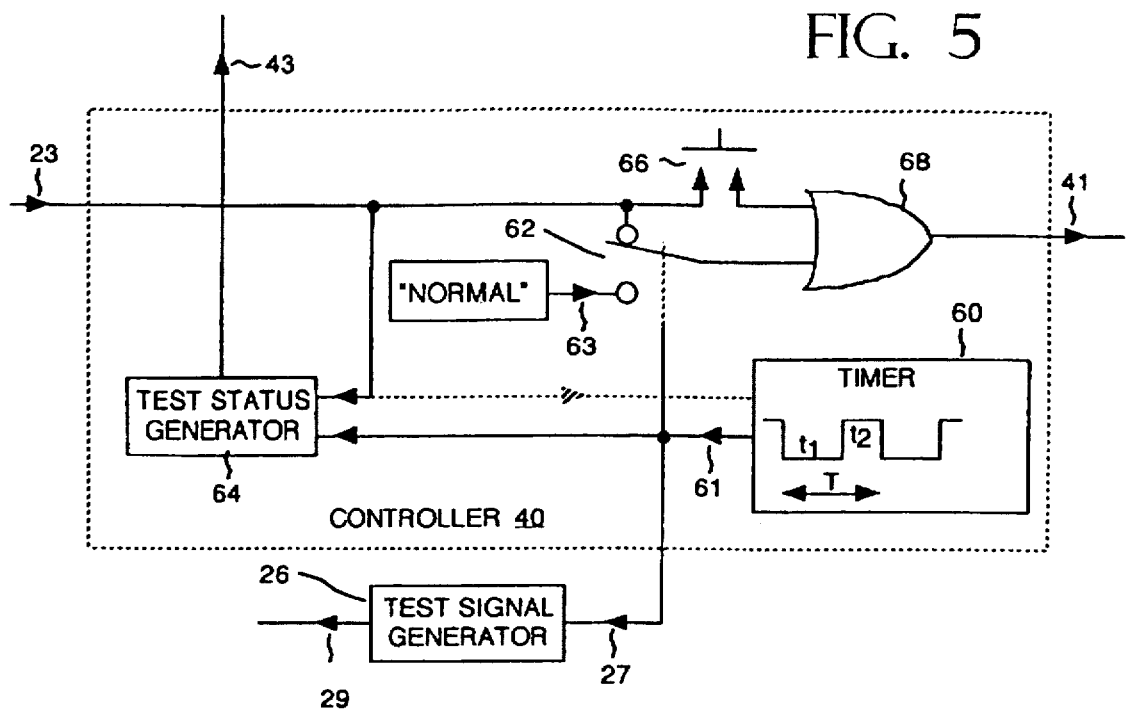
FIG. 5 is a functional diagram of a preferred controller for use in the receiver of FIG. 3.
Figure 6:
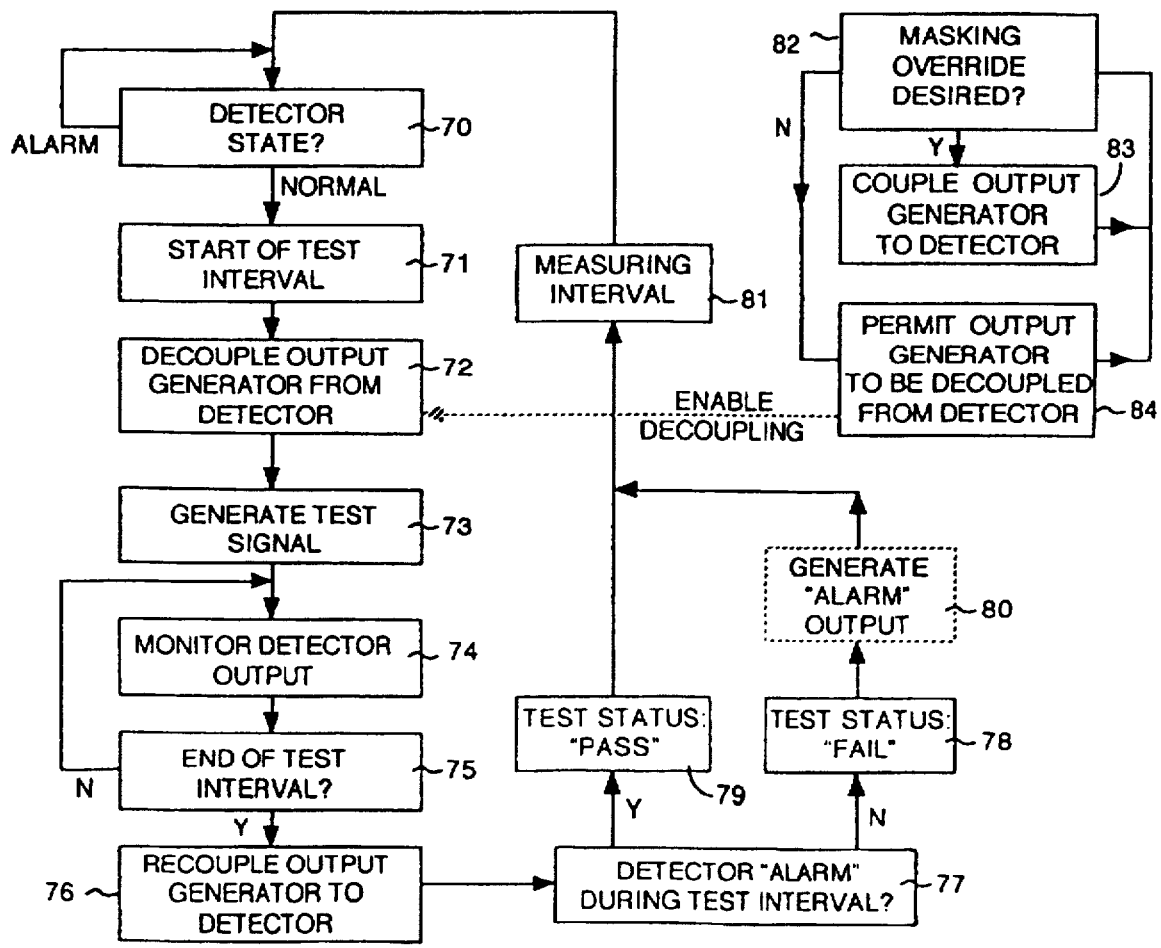
FIG. 6 is a flow diagram illustrating the operation of the controller of FIG. 5.

Accordingly, in a particularly preferred embodiment of the invention, the controller provides for both automatic periodic testing with the system output disabled, and manually controlled testing of the entire system when desired. FIG. 5 is a functional diagram of a preferred controller which provides these functions. FIG. 6 is a flow diagram illustrating the operation of the controller of FIG. 5, and FIG. 7 is a timing diagram illustrating sequences of events in testing. The controller of FIG. 5 includes a timer 60 which generates a periodic timing signal 61 having a period T that includes a measuring interval t1 and a testing interval t2. Timing signal 61 controls a switch 62, which during the measuring interval t1 is in the position as shown in FIG. 5. In this condition, detector signals 23 are passed through OR gate 68 to provide the controller output signal 41, and the output generator and its output signal are responsive to detected instrument signals. At the start of the testing interval t2, the timer output signal 61 provides a test initiation signal to test signal generator 26. During the test interval t2, switch 62 decouples the detector output signal 23 from gate 68 and substitutes a "normal" input signal 63 as the input to the gate. This "masks" the detector output signal 23 and causes the controller output signal 41 to indicate a normal condition during the test interval. Since there is generally little purpose to be served by testing the system when it is in the alarm condition, the detector output signal 23 may be supplied to timer 60 to inhibit periodic testing and generate the appropriate alarm output whenever detector output signal 23 goes to the alarm condition during the measuring interval t1, as shown by the dotted line in FIG. 5. A test status generator 64 receives the timer signal 61 and the detector output signal 23 to generate a test status signal 43. For instance, test status generator 64 may generate a signal 43 indicating a failed test if it does not detect a normal-to-alarm transition of detector output signal 23 during the testing interval t2.

The system of FIG. 5 includes a switch 66, illustrated as a manually actuatable push button, which may be actuated in order to test the operability of the entire system at any time. Actuation of switch 66 effectively overrides switch 62, and alarm signals 23 will be passed through gate 68 to the controller output 41 regardless of the position of switch 62. Thus if switch 66 is closed during the testing interval t2, the indicator or controller receiving the receiver output signal 25 will go to an alarm condition if and only if all elements of the system, including all of the measuring and testing circuitry and interconnections, are properly functional. An operator may actuate switch 66 in order to "certify" that the entire system, including the "watchman", is functional. An indicator may be provided which receives the timing signal 61 and indicates whether the system is in the measuring or test portion of the timer period, so that the operator can determine when the alarm should occur.

Switch 66 will usually comprise a manual switch; the operator can take appropriate steps to avoid drastic responses before actuating the switch, such as warning personnel to expect a testing alarm which should be ignored. In many cases it may be desirable for the system occasionally to generate an alarm output during testing; for instance, if tests are automatically made every minute, and it would be unacceptable to generate an alarm every minute, it may nonetheless be desirable for a test alarm to occur once a day, perhaps at the same time every day so that personnel could be advised to ignore alarms occurring at a certain time. This can be effected in several ways in the system of FIG. 5; switch 66 can include an automatically actuated switch which can be controlled to override switch 62 when desired, or timer 60 can be made to allow switch 62 to be in the position shown during a test interval.

FIG. 6 is a flow diagram illustrating a preferred method of operation of a controller in accordance with the foregoing. In step 70, the output state of the detector is determined, and testing does not proceed unless the detector output signal is its normal state. Step 71 indicates the start of a test interval. In step 72 the output generator is decoupled from the detector and a "normal" controller output signal is generated to "mask" the output from the effects of the test. In step 73, a test signal is generated. The detector output is monitored in steps 74 and 75 until the end of the test interval, at which point the output generator is recoupled to the detector in step 76. If the detector output went to the alarm condition during the test interval, as determined in step 77, a test status signal is generated in step 79 indicating that the test was passed. If the detector output did not go to the alarm condition during the test interval, in step 78 a test status signal is generated indicating that the test was failed. If desired, as indicated in step 80, in the event of a test failure the system may force its output to the alarm state. After the test interval has concluded, in step 81 the controller enters a measuring interval during which it generates outputs corresponding to the detector outputs.

The automatic periodic masked self-checking process of steps 70–81 occurs while switch 66 is open, as shown in FIG. 5. Steps 82, 83, and 84 illustrate the effect of the state of switch 66 on the process of steps 70–81. In step 82, a determination is made as to whether the output masking function should be overridden. If so, the output generator is coupled to the detector in step 83, in effect nullifying or overriding step 72. If not, in step 84 the output generator is permitted to be decoupled from the detector, i.e. the process of steps 70–81 is permitted to proceed as shown.

FIG. 7 is a timing diagram illustrating various signals which may occur in the system of FIG. 5. Signal A illustrates a timing signal 61 which may be provided by the timer 60. Such a signal may have an overall period T of ten seconds, divided into a measuring interval t1 of seven seconds and a testing interval t2 of three seconds, as for example in the embodiment of FIG. 8. The overall period T is selected so that tests are performed at the desired frequency, and the test interval t2 is longer than the response time of the system to a test signal and the length of time during which the test condition will be applied. Signal B illustrates periodic test signals 29 which are generally coincident with the commencement of the test interval t2.

Signals C, D, and E illustrate the controller operation when the receiver output is to be masked during testing. Signal C shows a detector output signal 23 which goes from its normal state to its alarm state during each test interval t2. This is a correct system response, and so the test status output signal 43 shown as signal D remains in the "pass" state. Because the system output is masked, the controller output signal 41 illustrated as signal E remains in its normal state and does not respond to the alarm conditions of the detector signal C which occur within the test intervals.

Signals F, G, and H illustrate testing when the system output is not to be masked. In the first test interval t2 shown, the system properly responds with a detector signal 23 correspond to an alarm. The test status output signal 43 indicates this as a passed test, and because the system output is not to be masked, the controller output 41 follows the detector output into an alarm state. However, in the second test interval t2 shown, the detector output 23 does not change, indicating that there is a fault someplace in the measuring system, the testing system, or their interconnections. Signal H shows a controller output signal 41 which does not change in the second test interval t2, which would result in a system output which did not change at the appropriate time and which therefore would indicate to the operator that a system failure had occurred. Signal G shows a test status signal 43 which generates a failed-test output at the end of the test interval in which the failure occurred.

It should be noted that the block diagrams of FIGS. 1, 3, and 5, and the functions attributed to them in FIGS. 4, 6, and 7, are intended to be illustrative but not limiting. For instance, while the controller of FIG. 5 could be implemented with separate blocks of circuitry separately performing the timer, test status generator, switching and gating functions shown, it could also equivalently be implemented by a microcomputer system with hardware and software provided to effect the overall functions described.

Figure 8A:
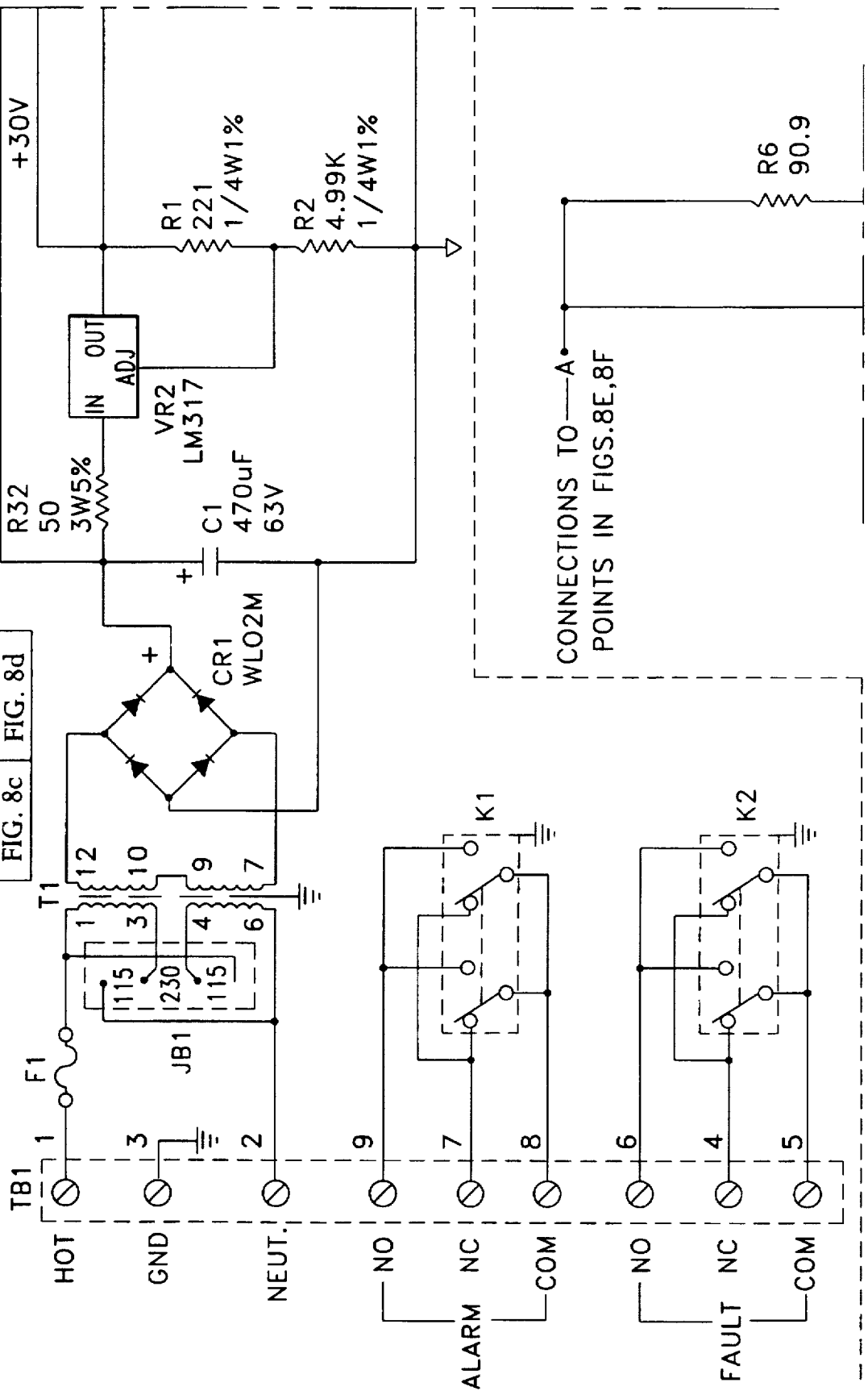
FIG. 8a–8d the schematic diagrams of a preferred receiver in accordance with the invention.
Figure 8B:
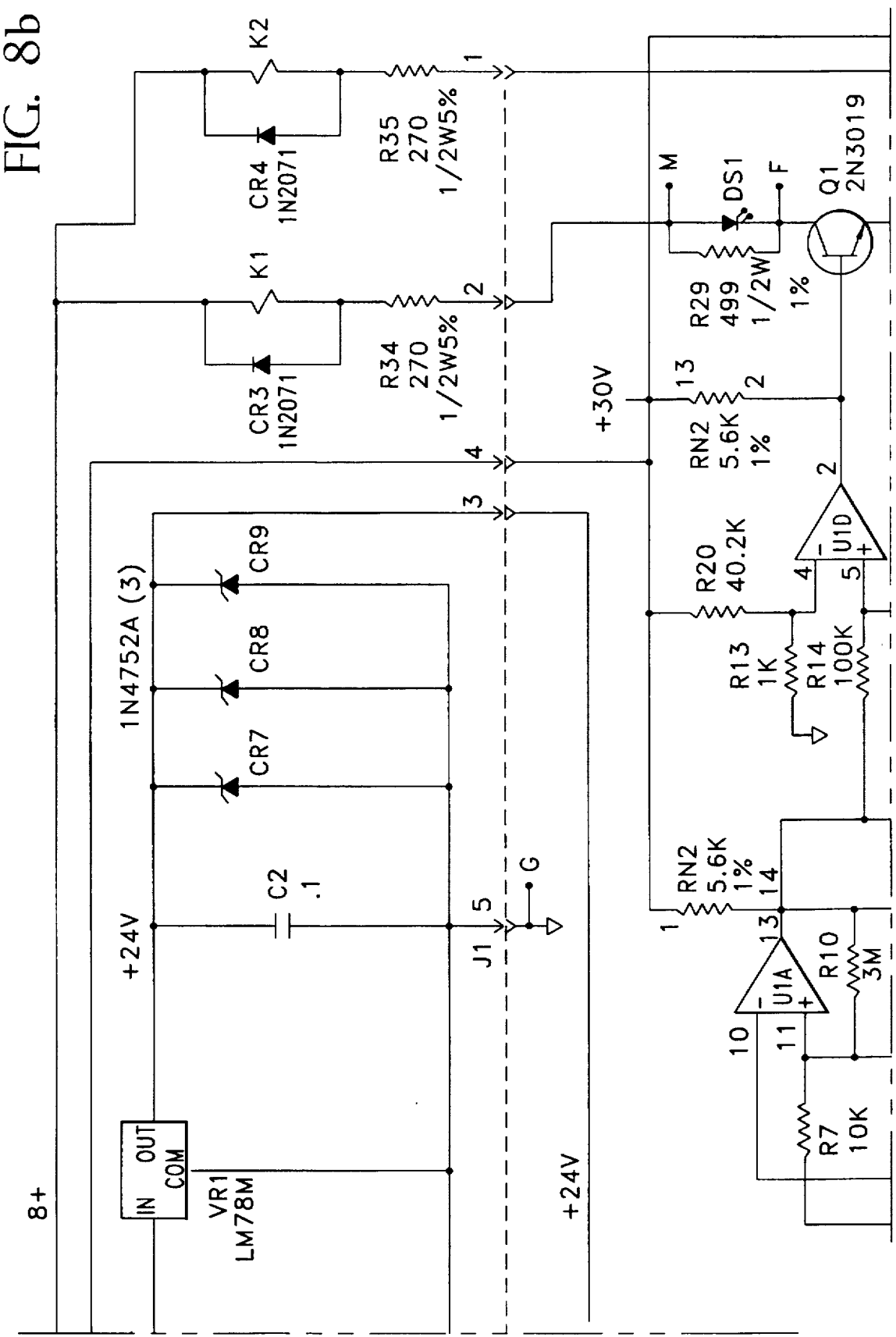
Figure 8C:
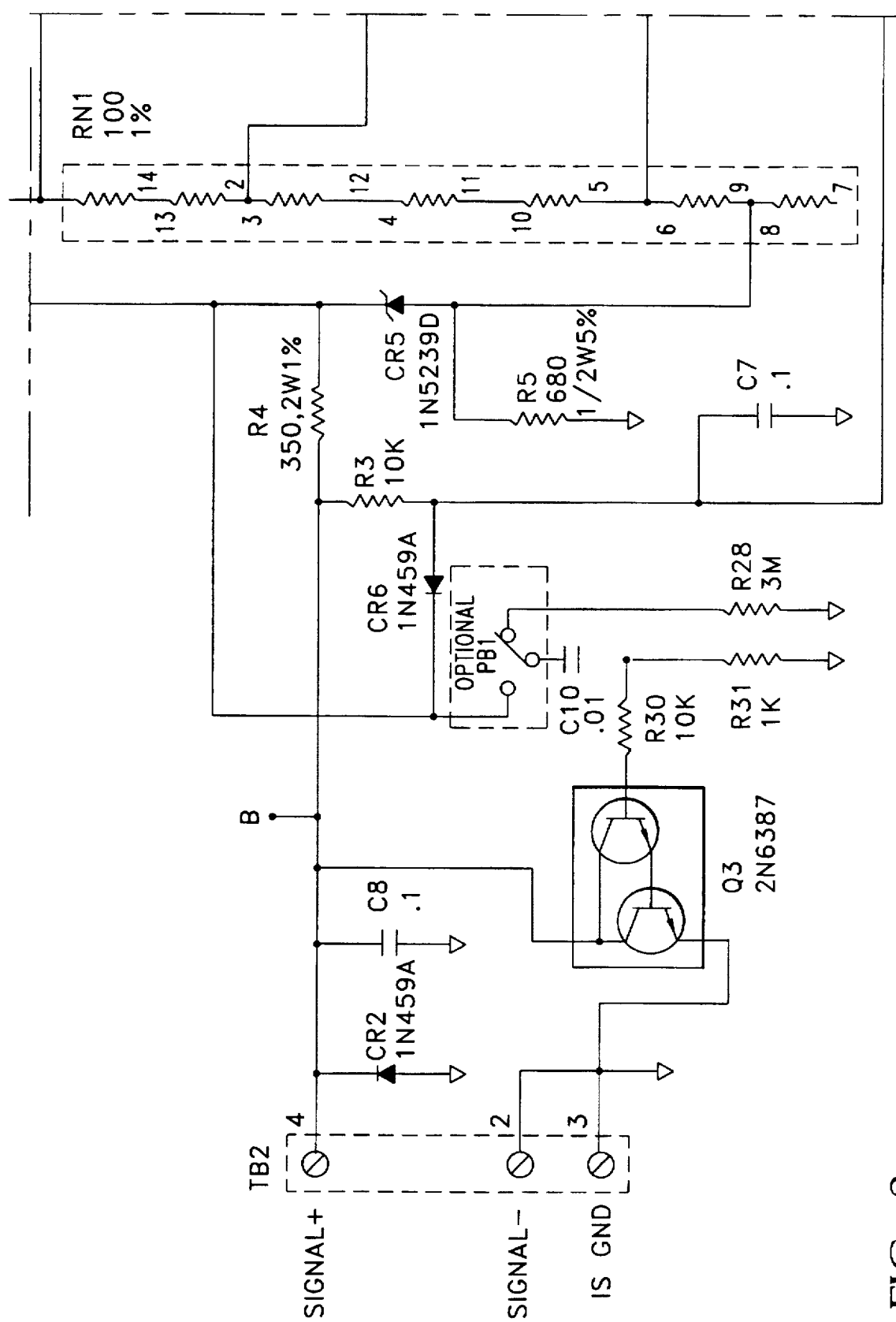
Figure 8D:
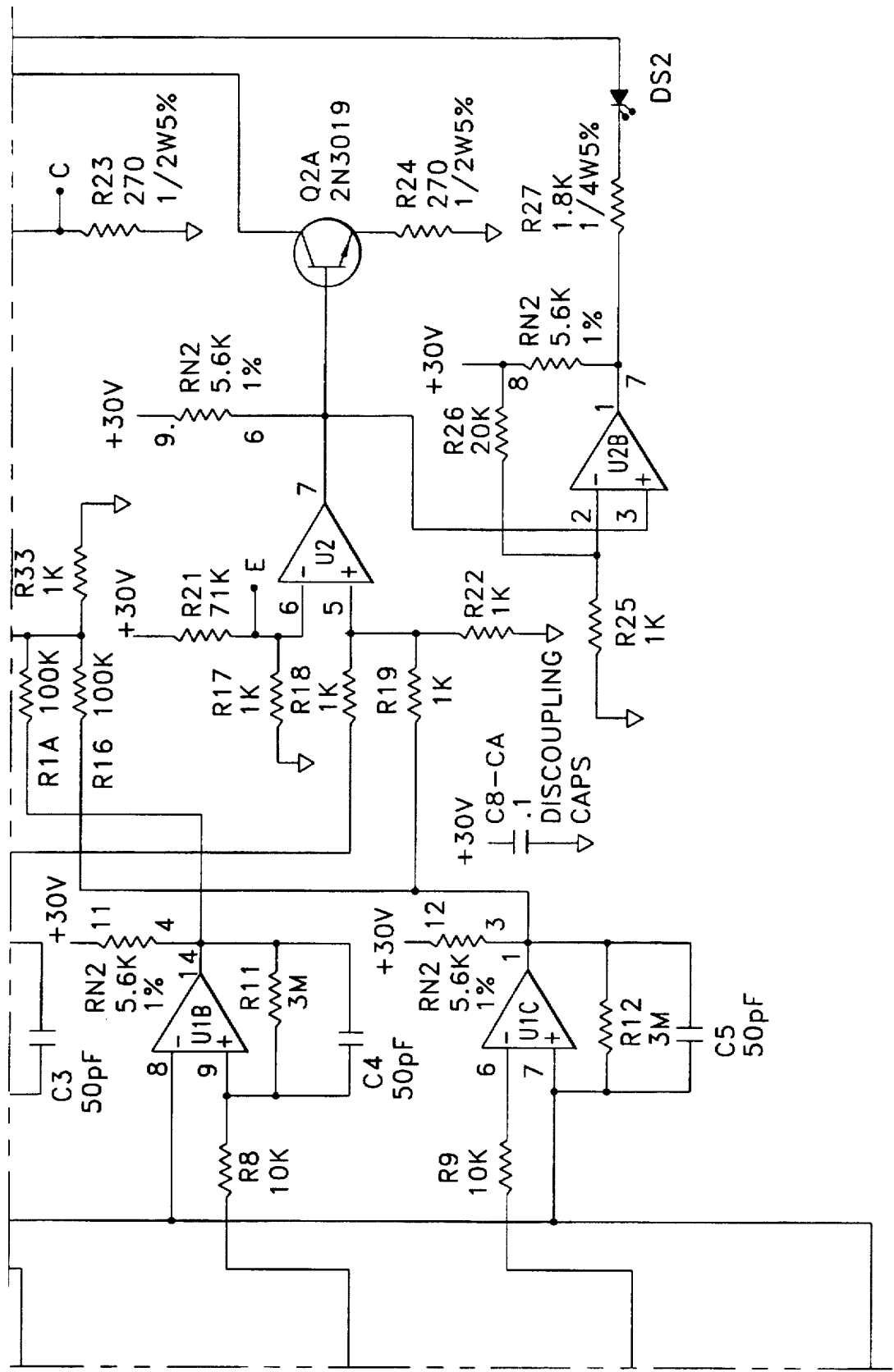
Figure 8F:
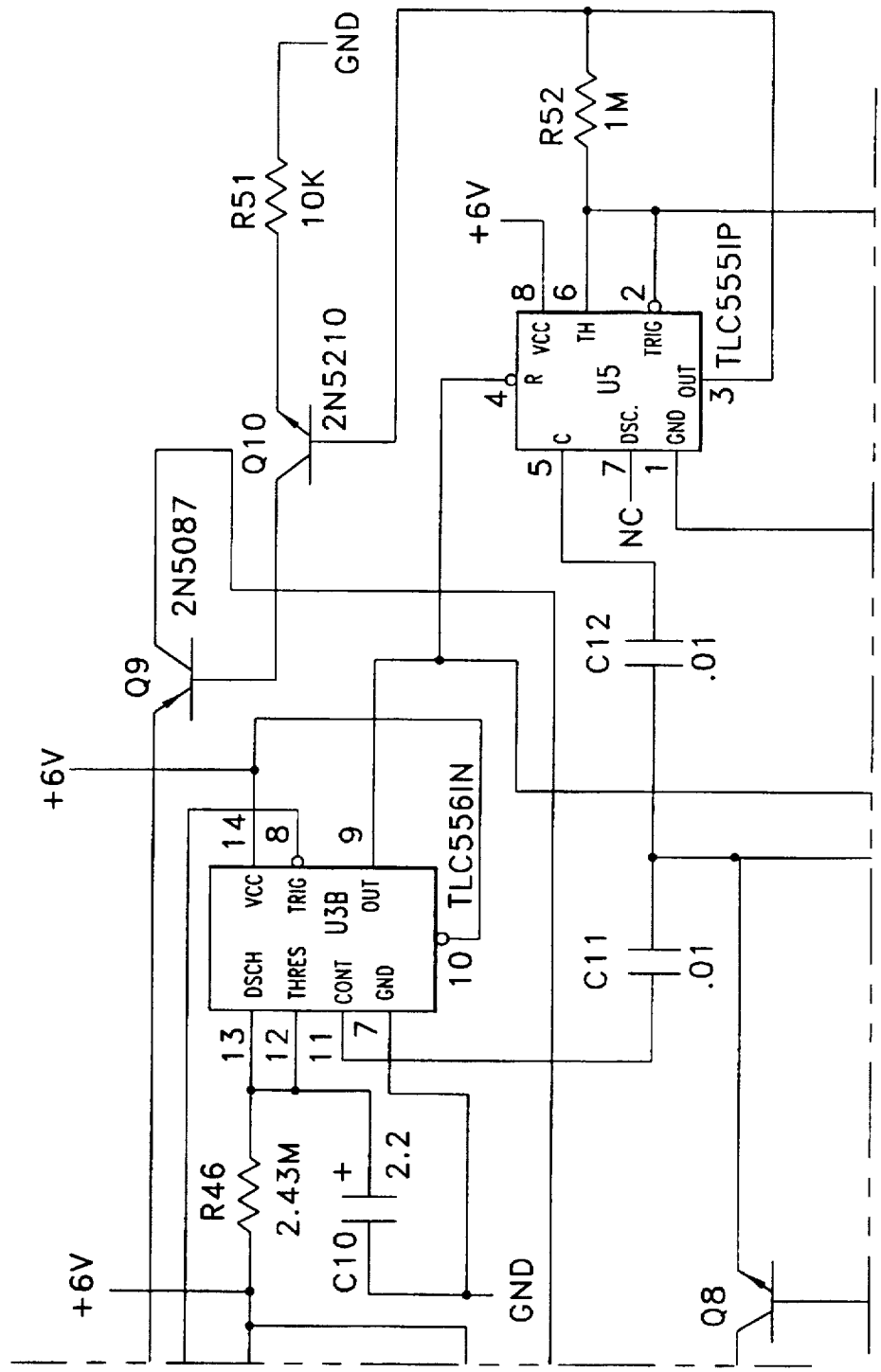
Figure 8G:
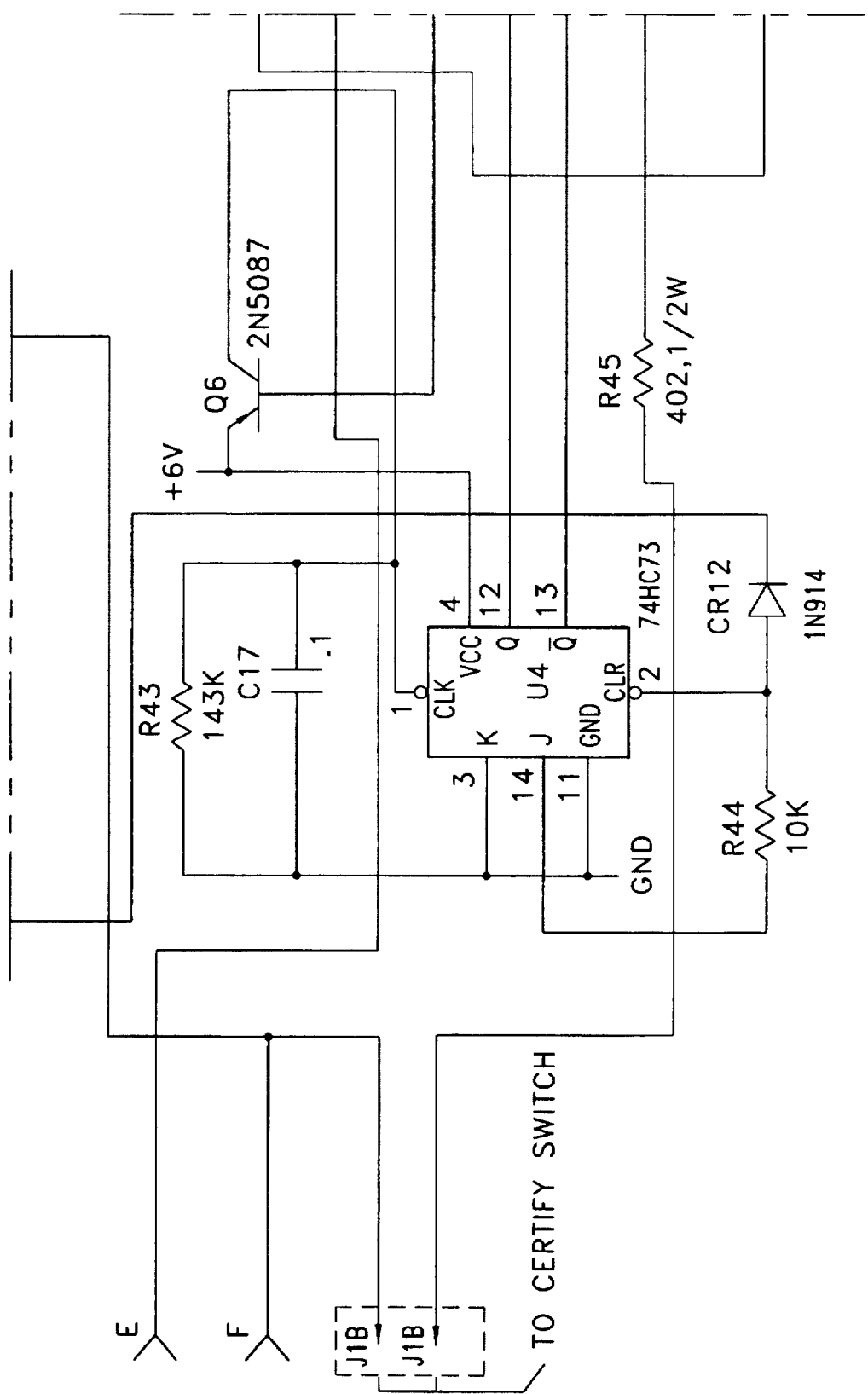
Figure 8H:
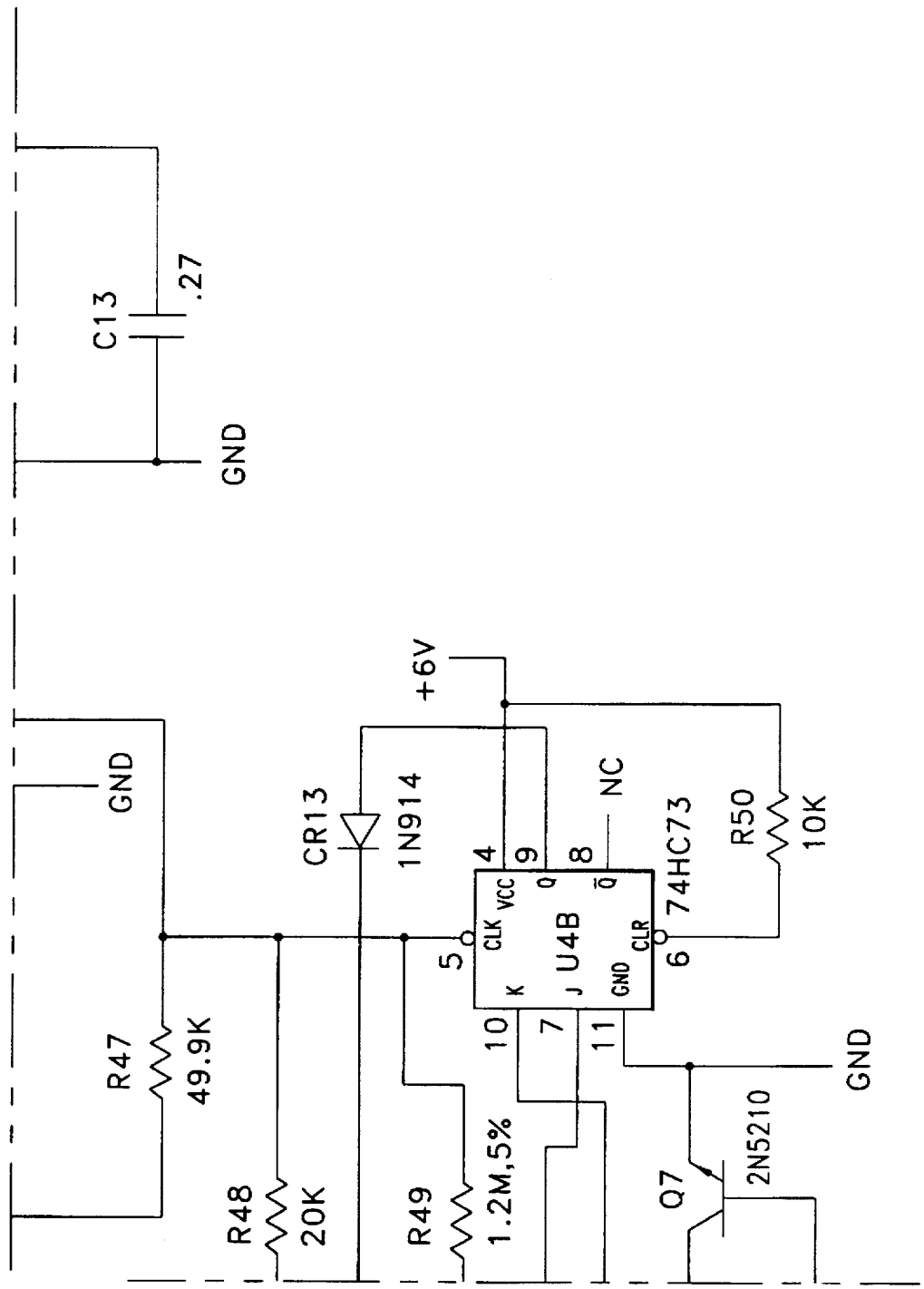

FIG. 8a–8h are schematic diagrams of a preferred test signal receiver in accordance with the invention. FIGS. 8a and 8b may be placed side-by-side to show their interconnections, as may 8c and 8d; connections between 8a, b, and 8c, d are indicated by lettered connection points. The operation of the circuit to perform the specified functions should be understood by those skilled in the art with reference to the following brief description. Generally, the receiver is for a two-wire on-off system and includes fault detecting functions similar to those described in U.S. Pat. No. 4,363,030. Thus, in addition to the measurement-related output signal indicating a normal or alarm condition which is derived by comparison of the loop current with a threshold (e.g. 12 mA), the receiver also generates a fault signal output which is responsive to the current in the signal wire loop. The fault signal is a bistable signal which assumes one state under fault conditions, and the other state in the absence of fault conditions or under "no-fault" conditions. Such fault conditions may include a detected signal current of less than a minimum amount (e.g. 4 mA) or greater than a certain amount (e.g. 20 mA). Such out-of-bounds current conditions generally indicate shorted or open signal wires but may also reflect failures in the remote instrument or even in the receiver.

Referring to FIG. 8a–8h a line operated power supply includes a transformer T1, the secondary of which is rectified and filtered by diode bridge CR1 and capacitor C1 respectively, to provide a B+ supply. A voltage regulator circuit based upon integrated circuit VR2 provides a 30 volt regulated output, and a regulator based on integrated circuit VR1 provides a 24 volt output. Current drawn from the signal wires through the SIGNAL+terminal flows through resistor R4 generating a current-dependent voltage at point B with respect to the +24 V supply. This signal voltage is filtered by R3 and C7 to remove noise and supplied to inputs of comparators U1A, U1B, and U1C which may comprise a type LM 2901 integrated circuit. The other inputs of U1A, B, and C are biased by a resistor string including R5, R6, and a resistor network RN1. The bias voltages provided by this resistor network establish voltage switching points for the comparators corresponding to loop currents of about 4 mA, 12 mA, and 20 mA, respectively. The outputs of comparators U1A, B, and C are combined using gates formed from comparators U1D and U2A and their input biasing components. Thus the output of comparator U1D is high if the sensed current is between 12 and 20 mA, i.e. in the "normal" current range, and low otherwise. Relay K1 provides the main or "alarm" output indicating a normal or alarm condition, and relay K2 provides a "fault" output indicating a fault or no-fault condition. A high output of comparator U1D turns on transistor Q1, energizing relay K1 to provide a "normal" relay output signal and LED DS1 to provide a visual indication that K1 is energized. The output of comparator U2A is high when the signal current is anywhere in the allowed range of 4–20 mA, which turns on transistor Q2 to energize relay K2 and provide a "no-fault" relay output signal. Comparator U2B functions as an inverter, so that LED DS2 is off in the absence of a fault.

Referring to FIGS. 8a–8h , integrated circuit VR3 provides a regulated 6-volt output. A timer providing a total period of about 10 seconds including an approximate seven second measuring interval and three second testing interval is based upon integrated circuit timers U3A and U3B which may comprise a dual timer as indicated. The output of U3B, at pin 9, provides a timer output signal corresponding to the signal 61 of FIG. 5. The discharge line of U3A, operating through Q4B, provides a brief negative voltage pulse to the positive signal wire at point B in FIG. 8a to provide a testing signal at the beginning of the testing interval. During the testing interval, an oscillator based upon integrated circuit timer U5 is permitted to run; it periodically shorts between points M and F shown in FIG. 8b, to provide a visible flashing of LED DS1 to indicate that the test interval is in process. Also during the testing interval, transistor Q7 is turned on to draw current to ground from connection point F through the "certify" switch indicated in FIG. 8c, thus shunting transistor Q1 and "masking" the alarm output relay K1 during the testing interval by maintaining it in the energized "normal" condition. Thus the function of OR gate 68 of FIG. 5 is implemented by a parallel pair of coil drivers for relay K1; current flow in either Q1, due to a detected "normal" signal loop current, or in Q7, which is turned on during the test interval, will energize K1 to provide the normal system output at the alarm terminals of TB1. A normally closed "certify" switch, connected to points J1B, may be opened in order to override the masking function and permit the alarm relay K1A to become de-energized upon detection of an alarm during the test interval. A particularly preferred type of switch for this function is a magnetically actuated switch; these can be actuated without opening a housing containing the receiver by placing a magnet against the housing. A latching circuit comprising a pair of flip-flops U4A and U4B is provided to detect alarm conditions occurring during the testing interval, and to provide an output signal to connection point E which controls the fault relay K2 and fault indicating LED DS2 shown in FIG. 8b. The voltage at point C is used both to indicate whether a test was passed, by clearing U4A, and to inhibit testing when an alarm is detected by inhibiting the operation of timer U3A.

Figure 9:
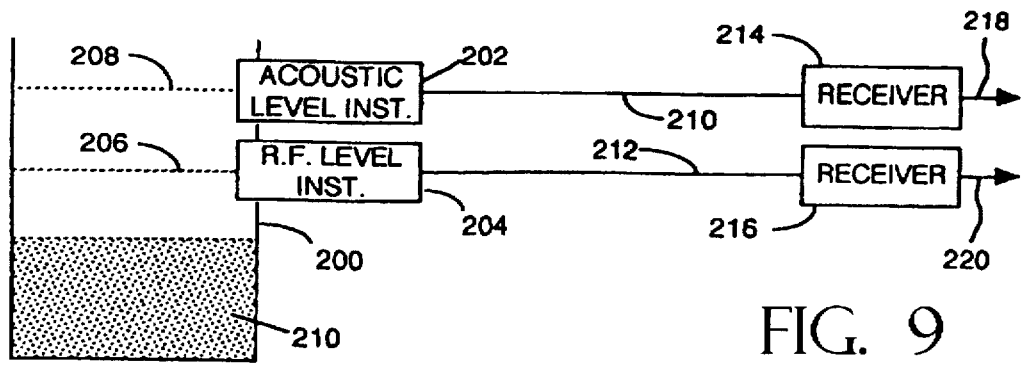
FIG. 9 is a block diagram illustrating a system including both acoustic and radio frequency high level alarms.

One frequently used technique to increase the reliability of a system is to provide redundant system components. Level measuring systems have been used which include redundant level measuring instruments, one of which may be disposed to generate a "high" alarm if the level exceeds a first threshold and another of which may be disposed to generate a "high high" alarm output if the material level reaches a second, higher threshold. Such a system may desirably be "quasi-redundant". Such a system is illustrated in FIG. 9, in which a vessel 200 includes two different types of level measuring instruments. As shown, a radio frequency level measuring instrument 204 is disposed as a "high" alarm to provide an alarm output signal if the level of material 210 in vessel 200 exceeds the level indicated by the dashed line 206. An acoustic level measuring instrument 202 is provided as a "high high" level alarm and is disposed so as to provide an alarm output if the level of the material 210 in vessel 200 exceeds the level indicated by the dashed line 208. Level measuring instruments which operate on acoustic measurements are generally implemented as ultrasonic devices.

Simulating a material condition for testing purposes can be relatively straightforward for radio frequency type level measuring instruments, because the material-related signals developed in such instruments are electrical properties which are relatively easy to simulate. These properties may include admittances, such as resistances or capacitances, or radio frequency voltages or currents. Electrical switches may be provided to switch testing admittances, voltages, or currents into an RF instrument at an appropriate point in order to simulate a particular desired measuring condition. Because acoustic instruments generally rely on the acoustic impedance of the material and its measuring environment for their fundamental signal acquisition, and it is more difficult to simulate acoustic impedances or signals than electrical ones, it is generally more difficult to test such instruments. However, in accordance with the present invention, a system for acoustic measurement is provided which is not only readily testable in order to determine its operational status, but may be tested remotely by a receiver which is identical to that previously described herein. Accordingly, quasi-redundant instrument systems can be provided which include a single type of receiving equipment and different types of level measuring instruments.

Figure 10:
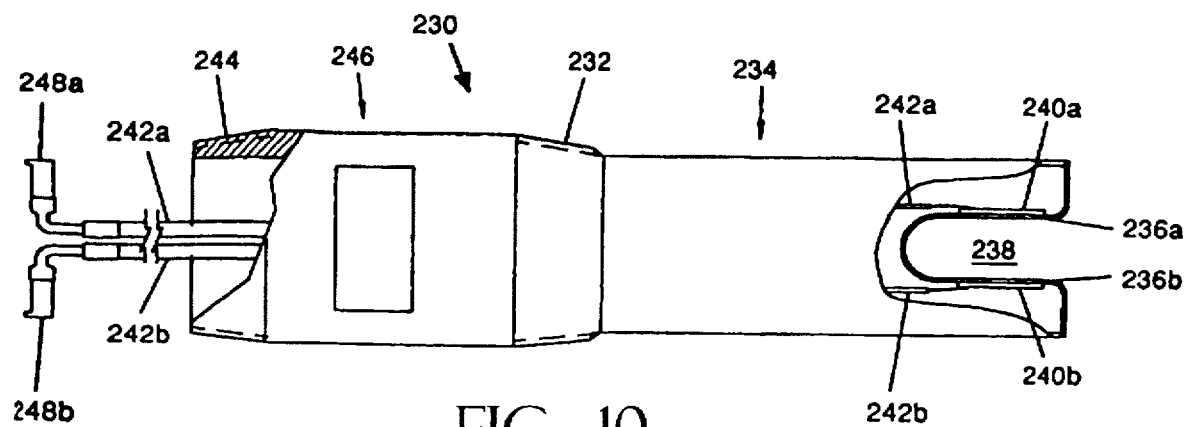
FIG. 10 is a partially cut away side view of an acoustic sensor.

FIG. 10 is a partially cutaway view of a "gap" type acoustic sensor which is known in the art and may be used in an acoustic instrument in accordance with the invention. The sensor 230 is a generally tubular structure having a threaded portion 232 which may be secured to a vessel wall so that a portion 234 protrudes into the interior of the vessel. The insertion portion of the sensor includes a pair of generally opposed sensor wall surfaces 236a, b which define a gap or space 238 into which material may flow as a vessel is filled with material above the level at which the sensor 230 is disposed. A pair of electroacoustic transducers 240a, b are secured to the sensor wall structure adjacent the gap 238. Such electroacoustic transducers 240 are desirably implemented as piezoelectric crystal transducers, which are adhesively secured to the walls 236. A pair of leads 242a, b are secured to the crystals 240 to couple electrical signals between the crystals and an instrument. Leads 242 are brought through the hollow sensor structure and emerge from the portion 246 of the sensor which is exterior to the vessel wall, where they are terminated in connectors 248 that may be connected to a transmitter. A threaded portion 244 on sensor 230 is provided to secure a housing to the sensor, which housing may contain instrument electronics to provide an integral-type instrument or may include wiring interconnections to enable the conductors 242 to be coupled to remotely located transmitter.

Figure 11:
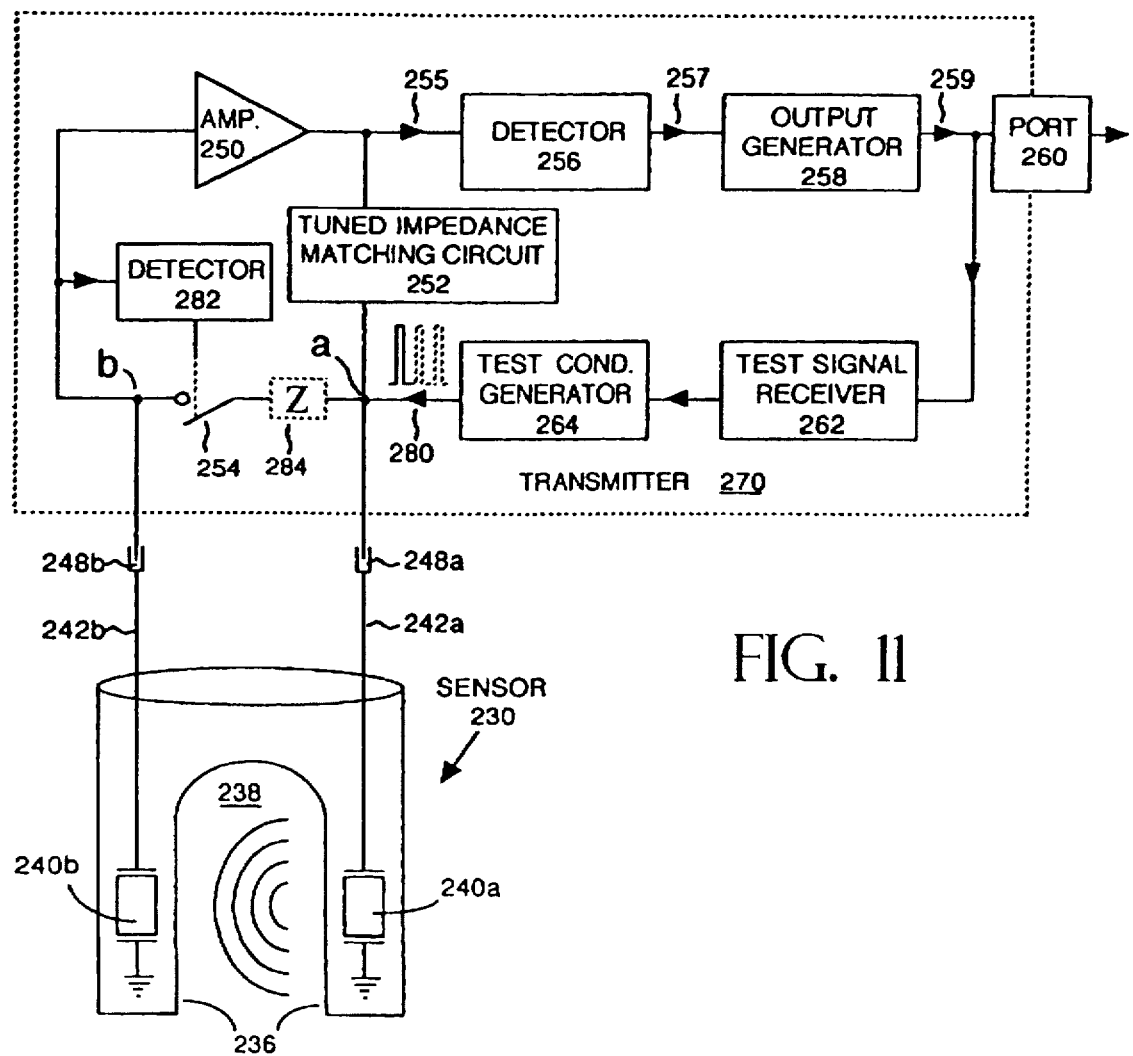
FIG. 11 is a block diagram of an acoustic instrument having improved operability testing means.

FIG. 11 is a functional diagram illustrating the basic elements of a testable acoustic transmitter system in accordance with the present invention. FIG. 11 includes a gap type acoustic sensor which is shown functionally in FIG. 11 but is preferably implemented by a sensor as shown in FIG. 10. Accordingly, reference numerals corresponding to those in FIG. 10 are used in FIG. 11. The sensor 230 in FIG. 11 is coupled to a transmitter 270, which transmitter includes an amplifier 250, a tuned impedance matching circuit 252, a detector 256, and an output generator 258. The sensor 230 is arranged in the feedback path of amplifier 250 to form a "marginal" oscillator, i.e. an oscillator which changes from an oscillating to a non-oscillating state in accordance with changes in the feedback. Crystals 240a and 240b are resonant devices having nominally the same resonant frequencies, which may be on the order of 3 MHz. Crystal 240a is coupled to the output of amplifier 250 through a tuned impedance matching circuit 252, which is tuned to the resonant frequency of the crystals 240. Crystal 240b is coupled to the input of amplifier 250. Crystal 240a is acoustically coupled to crystal 240b through whatever means is used to secure the crystals 240 to the sensor walls 236; through the sensor walls 236; and through the material in the gap 238. When the gain around the loop comprising amplifier 250, impedance matching circuit 252, and sensor 230 is unity and the phase shift is 360 degrees, the circuit will oscillate. Such circuits are generally designed so that oscillation will occur generally at the resonant frequency of the crystals 240, as affected by material in the sensor gap and the like. At such frequency, the gain of amplifier 250, loss of impedance matching circuit 252, electrical-to-acoustic conversion loss of crystal 240a and acoustic-to-electrical conversion loss of crystal 250b are fixed, as are other losses which may occur in the circuit. What is variable is the efficiency of acoustic transmission between crystal 240a and 240b. Transmission losses between the crystals are generally due to acoustic impedance mismatches between the sensor walls 236 and the material which fills the gap 238. The impedance mismatches are a function of the acoustic impedance of the material which fills the gap, so that changes in material conditions in the gap which result in a change in acoustic impedance are detectable by the sensor. This behavior may be advantageously employed to provide on-off level instruments for use with liquid materials, such as a high level alarm which responds to the substitution of a liquid for air in the gap when the material level in the vessel rises above the sensor. Such a material change results in several orders of magnitude change in the acoustic impedance. With appropriate choice of amplifier gains and of losses in other areas of the circuit, the apparatus may be designed so that the oscillation threshold value of material acoustic impedance in the gap 238 is in between the expected material conditions of interest, as for example air and an aqueous liquid. A circuit so designed will have insufficient loop gain to oscillate under low level conditions when the gap is filled with air and will have sufficient loop gain to oscillate when a high material level condition occurs. The presence of oscillations in the output signal 255 of amplifier 250 are detected by detector 256, which provide an output signal 257 to an output generator 258 so as to control the instrument output signal 259 supplied to the instrument output port 260 in accordance with the detected oscillation conditions.

In the manner illustrated in FIG. 1, the system of FIG. 11 may be remotely tested for operability by providing a test signal receiver 262 coupled to the port 260 for receiving test signals, and a test condition generator 264 to apply a test condition to the instrument. It is known to test operability by closing a switch between points a and b; this simulates the effect of a large feedback signal provided through the sensor 230. Closure of such a switch in response to receipt of a test signal should result in oscillation of amplifier 250, which would be detected and result in an alarm output signal 259 if the foregoing instrument circuits are properly functional. Such a switch might alternatively but less preferably be manually closed or automatically actuated by a timer in the instrument.

Testing merely by closing a switch between points a and b may fail to detect a number of faults which may occur in the system which would prevent the instrument from properly responding to a high level condition. For instance, if the sensor becomes disconnected from the transmitter, the system would not respond to a high level alarm condition but closure of a switch between points a and b during a test would provide an alarm output; this would falsely reassure an operator that the system would respond to the high level alarm system. Another fault which would have a similar effect is detachment of one of the crystals 240 from its wall 236, such as may occur upon failure of an adhesive used to secure them together. In that instance, the system would give a proper response during testing but would not properly respond to a real high level alarm condition.

The system illustrated in FIG. 11 addresses these problems and provides a system which tests substantially all components of the instrument. In the circuit of FIG. 11, the test condition generator 264 generates an electrical signal 280 which is coupled to point "a" in the feedback circuit of amplifier 250. The preferred signal 280 to be applied is an impulse or a short pulse, which may be applied repeatedly during a test interval in a series of pulses. If the sensor and other components of the instrument are properly functional, the test pulse 280 will be conducted by conductor 242a to crystal 240a which in turn will apply a mechanical pulse to the sensor wall structure. Acoustic transmission of the pulse through the sensor structure to the sensor wall adjacent crystal 240b causes a deformation of crystal 240b which generates an electrical signal in conductor 242b. Detection of such a signal by detector 282 causes closure of switch 254, so as to provide feedback around amplifier 250. The effect of such feedback in generating an instrument alarm output is as described above. If the sensor 230 becomes disconnected, or if a crystal 240 becomes detached, or if any other sensor failure occurs which prevents the detection of a response at point B to a pulse at point A, the switch 254 will not close and no change in instrument output will occur.

It is particularly preferred to include a feedback element in the switched testing feedback loop, as illustrated by impedance 284. The amount of the feedback provided may be selected in accordance with the procedure described above with respect to FIG. 2, so that if the circuit responds to the test feedback, it must respond to the feedback which would occur if material filled the sensor gap.

In applicant's tests of systems made according to FIGS. 10 and 11, it appears that the mechanical pulse provided by crystal 240a induces an oscillation of the sensor structure, including the gap walls 236, at a resonant frequency determined by the mechanical characteristics of the sensor. For instance, applicant's tests have provided oscillating electrical output signals from crystal 240b at a frequency of about 25 kHz. Such an oscillation will be damped, and therefore provisions must be made for detecting such damped oscillations and maintaining the switch 254 closed for a sufficiently long period of time that a detectable instrument output signal 259 may be generated. Use of an impulse or a short pulse as the test condition signal is advantageous because its harmonic content is likely to include a component at the sensor mechanical resonant frequency.

FIG. 12a–12h are schematic diagrams of a preferred embodiment of a transmitter for use in the instrument of FIG. 11. The transmitter is a two-wire transmitter adapted to receive power from and provide a current output signal to a pair of terminals indicated as +24 V and COM. A voltage regulating circuit based upon integrated circuit voltage regulator VR4 provides a regulated 7-volt output, indicated as +7 v, for operating various circuitry. An amplifier circuit based upon integrated circuit amplifier UG, type CA3012, provides the function of amplifier 250 in FIG. 11. The terminal labeled INPUT in FIG. 12a and 12b would connect with connector 248b in FIG. 11, and the terminal labeled OUTPUT in FIGS. 12a and 12b would connect with the connector 248a in FIG. 11. Inductors L1 and L2 and capacitor C25 form the tuned impedance matching circuit 252 of FIG. 11. Oscillations at the output of U6 are peak detected by diodes CR20 and CR21 to provide a high DC voltage level across C29 at the input of inverter U7B. The output of the inverter is applied to one input of a NOR gate U8D, the other input of which receives a control input from a control circuit comprising U8A-C. The control circuit is a multivibrator having an output which periodically turns Q11 on and off and controls power usage of U6 by duty cycle modulation of its supply. With the control input to U8D held low, U8D acts as an inverter and is responsive to its input from U7B; otherwise the output of U8D is held low to provide noise immunity when UG is not powered. The output of U8D is provided through inverters U7A and C and to a time delay circuit comprising resistors R69 and R70, diode CR23, and capacitor C31. This provides a relatively short delay on positive going transitions of the output of U7C, and a relatively long delay on negative going transitions of the output of U7C. A jumper indicated as JB1 may be placed either in the HL or the LL position to either bypass or include inverter U7D in the signal chain. The selected signal from JB1 is applied to the input of inverter U7E, which provides a change in the current drawn by the transmitter from the signal wires. When the output of inverter U7E is high, transistor Q12 is saturated and a current controlled by the value of R72 is drawn from the +7 V line, which current in turn flows through the regulator circuit and the signal wires. The net effect of the various signal inversions described above results in an addition to the signal current when U6 is not oscillating and JB1 is in the HL or high level fail-safe position.

Figure 12A:
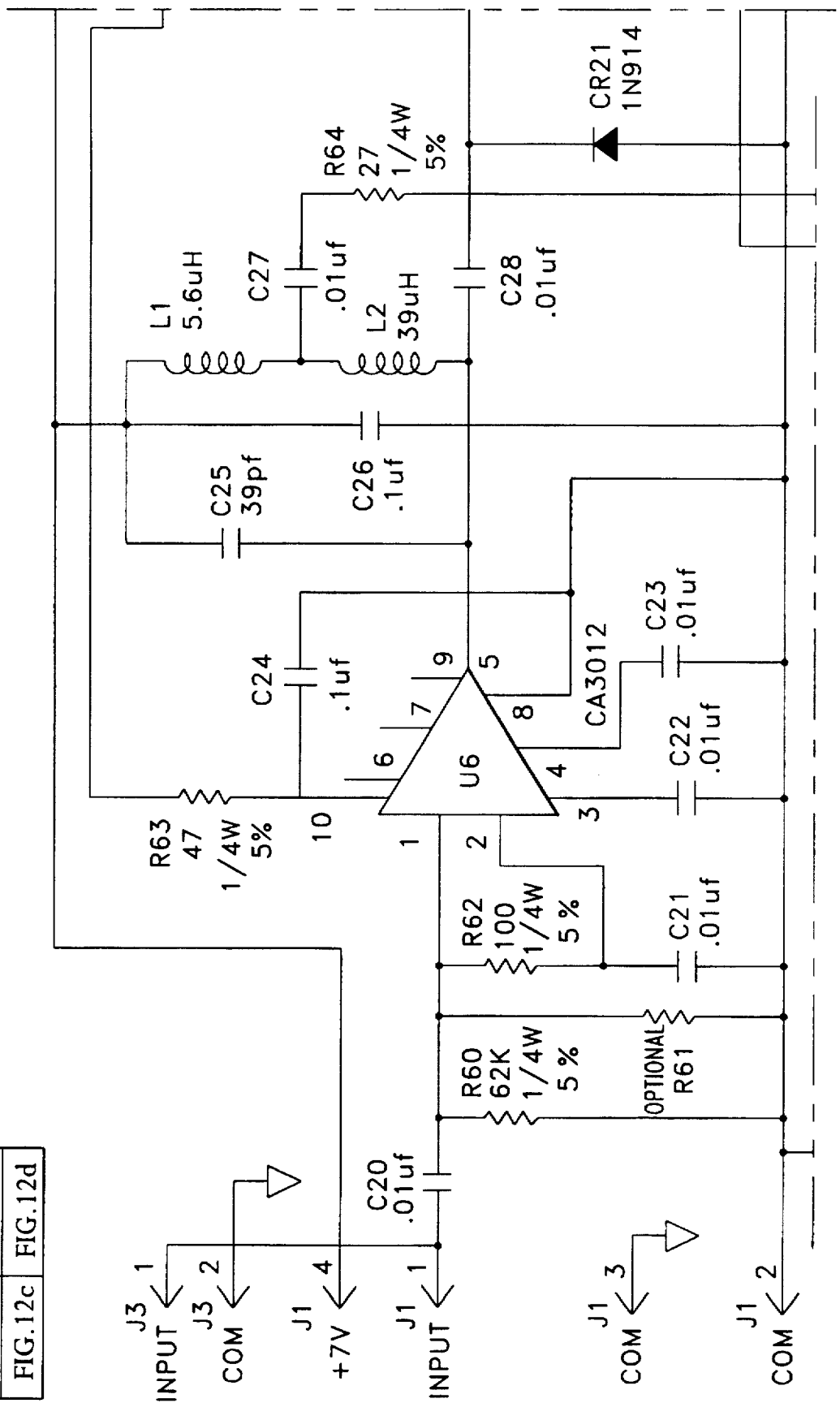
FIG. 12a–12h are schematic diagrams of a preferred acoustic instrument.
Figure 12B:
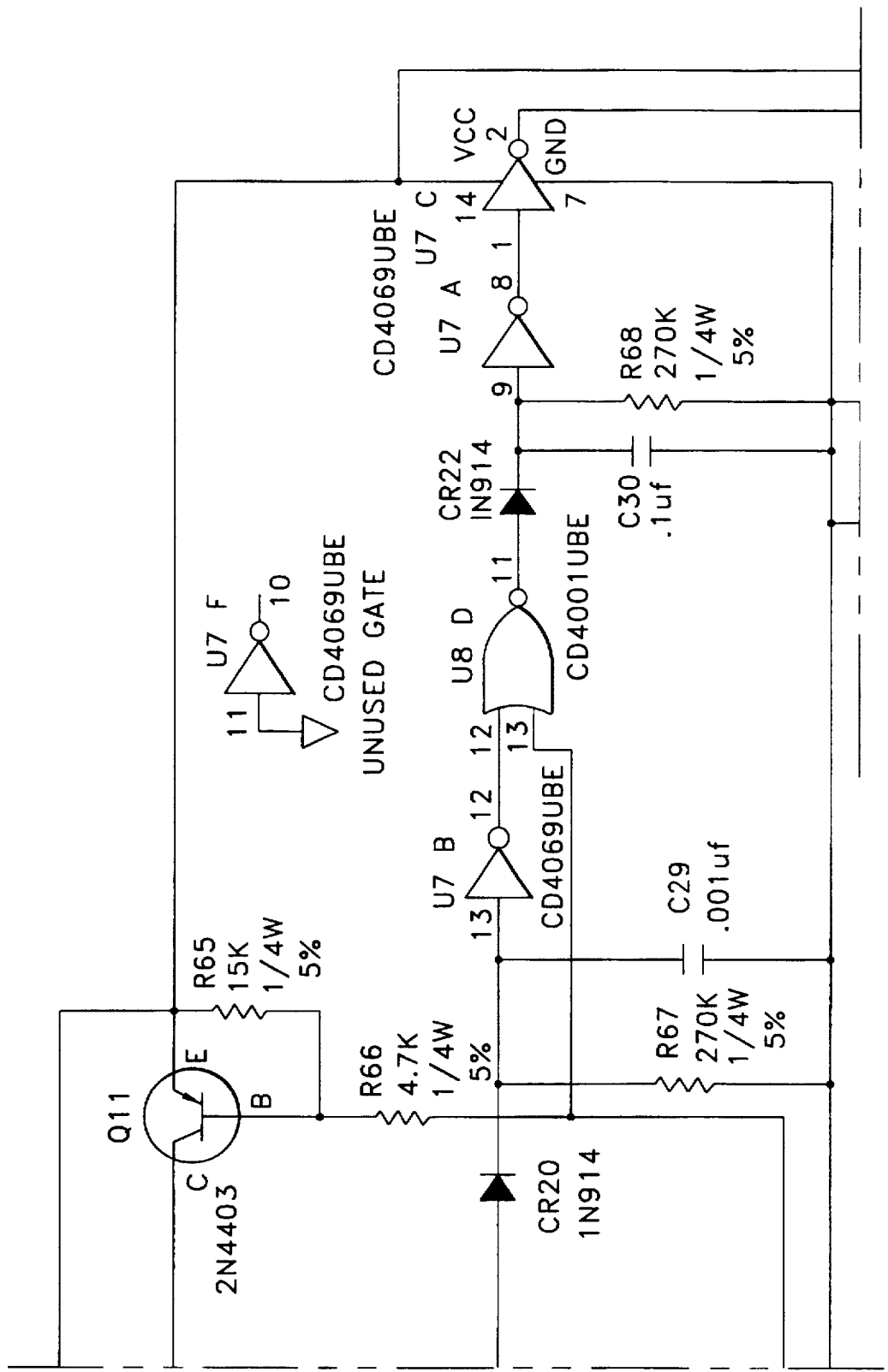
Figure 12C:
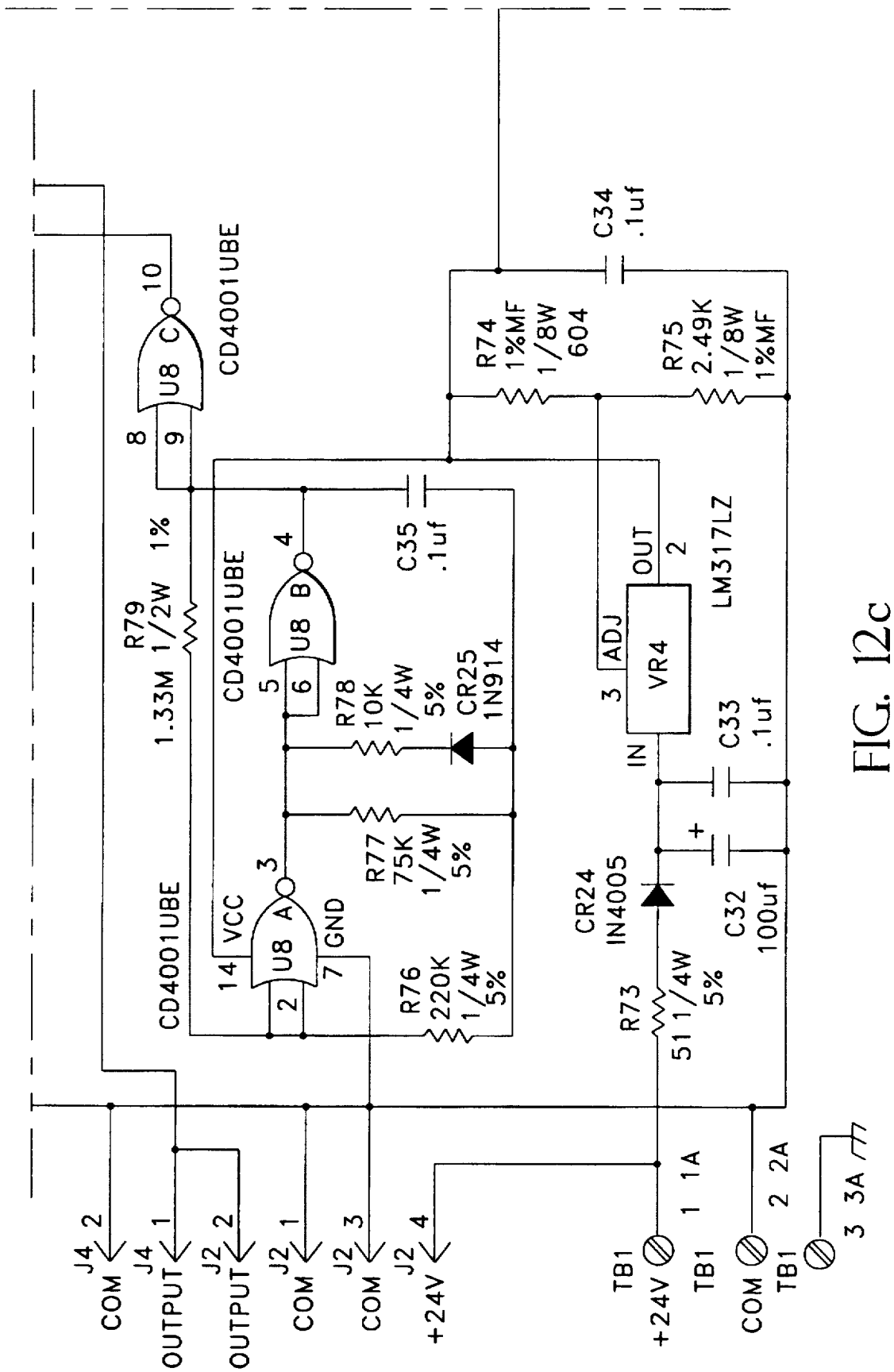
Figure 12D:
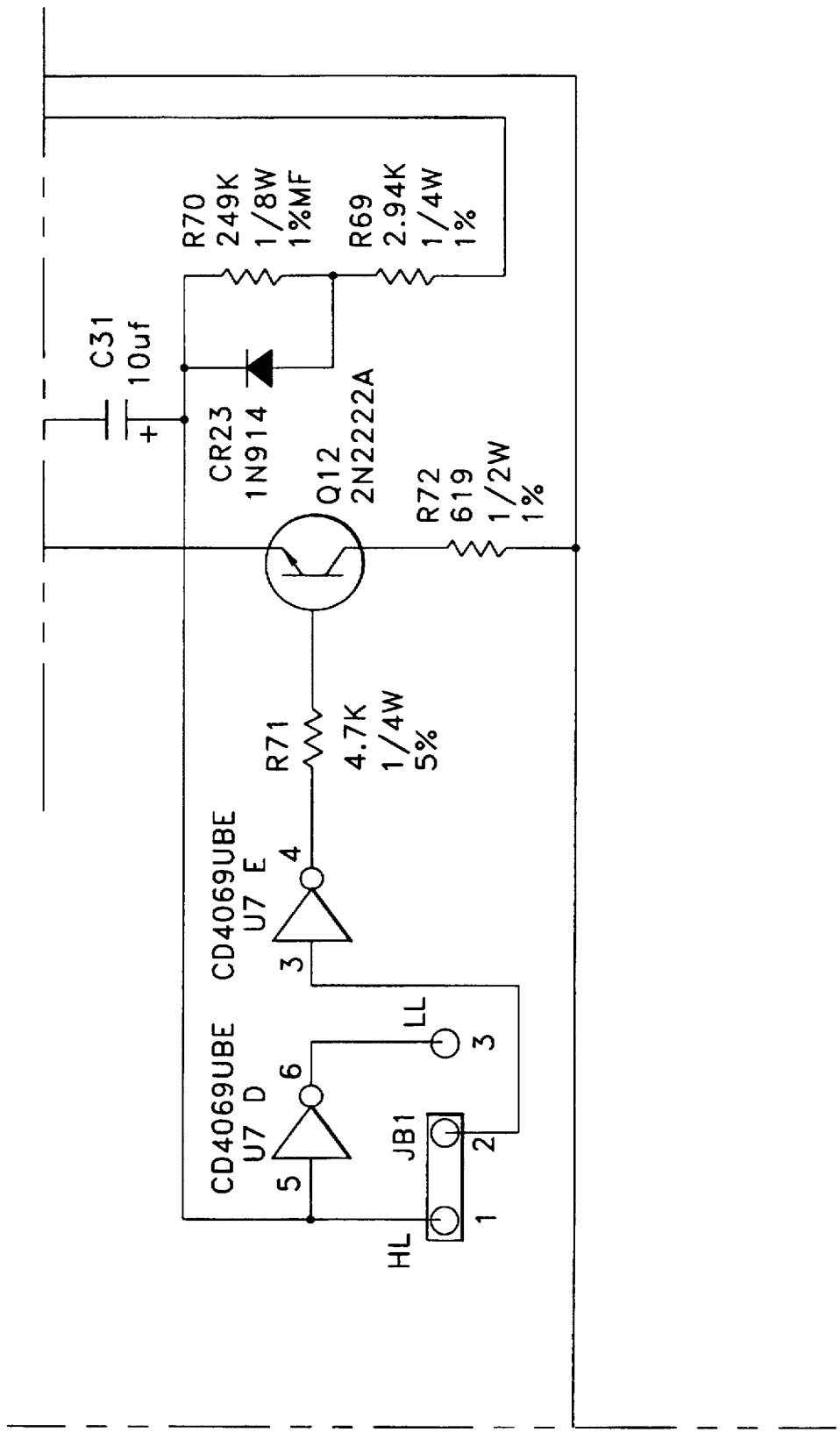
Figure 12E:
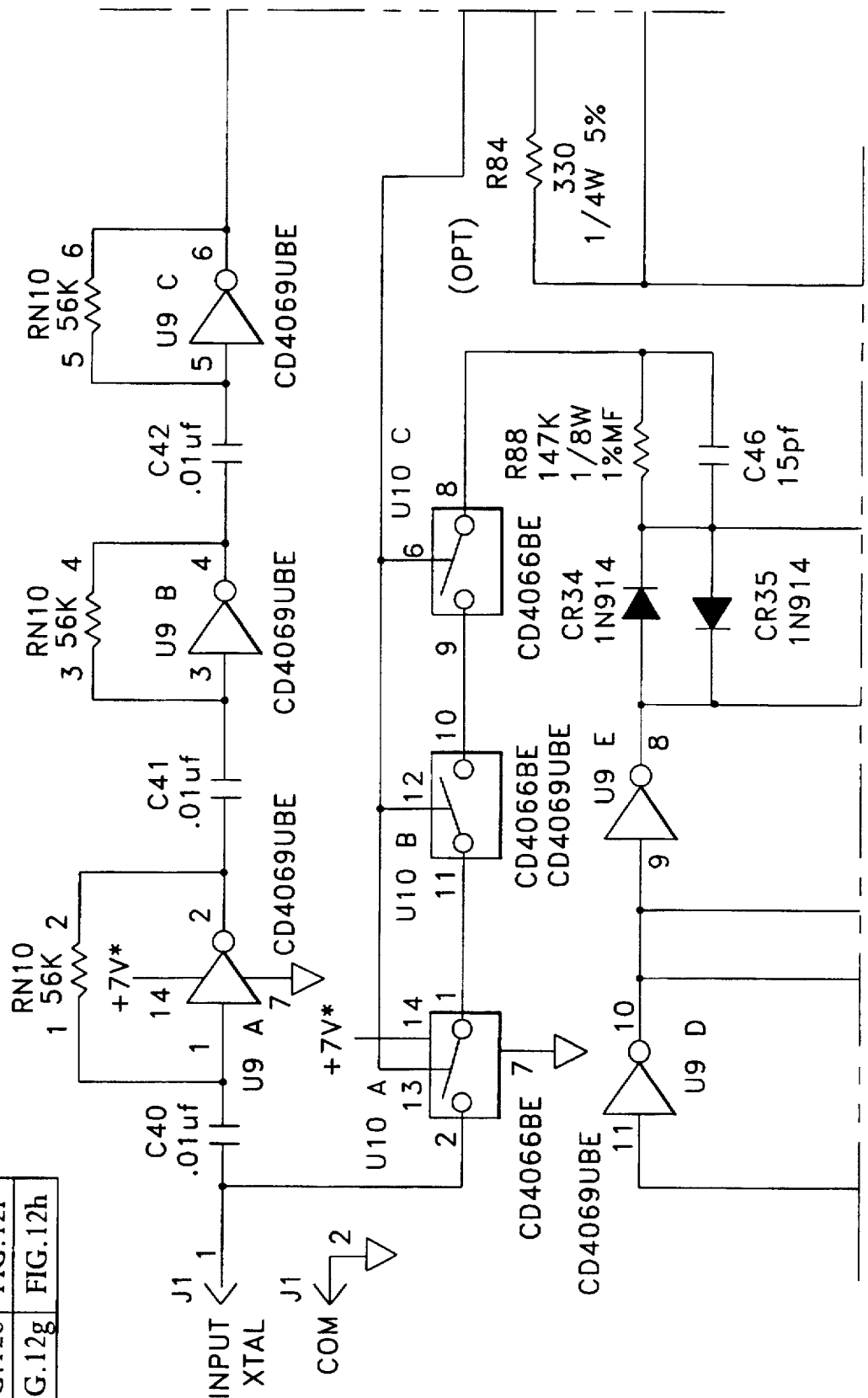
Figure 12F:
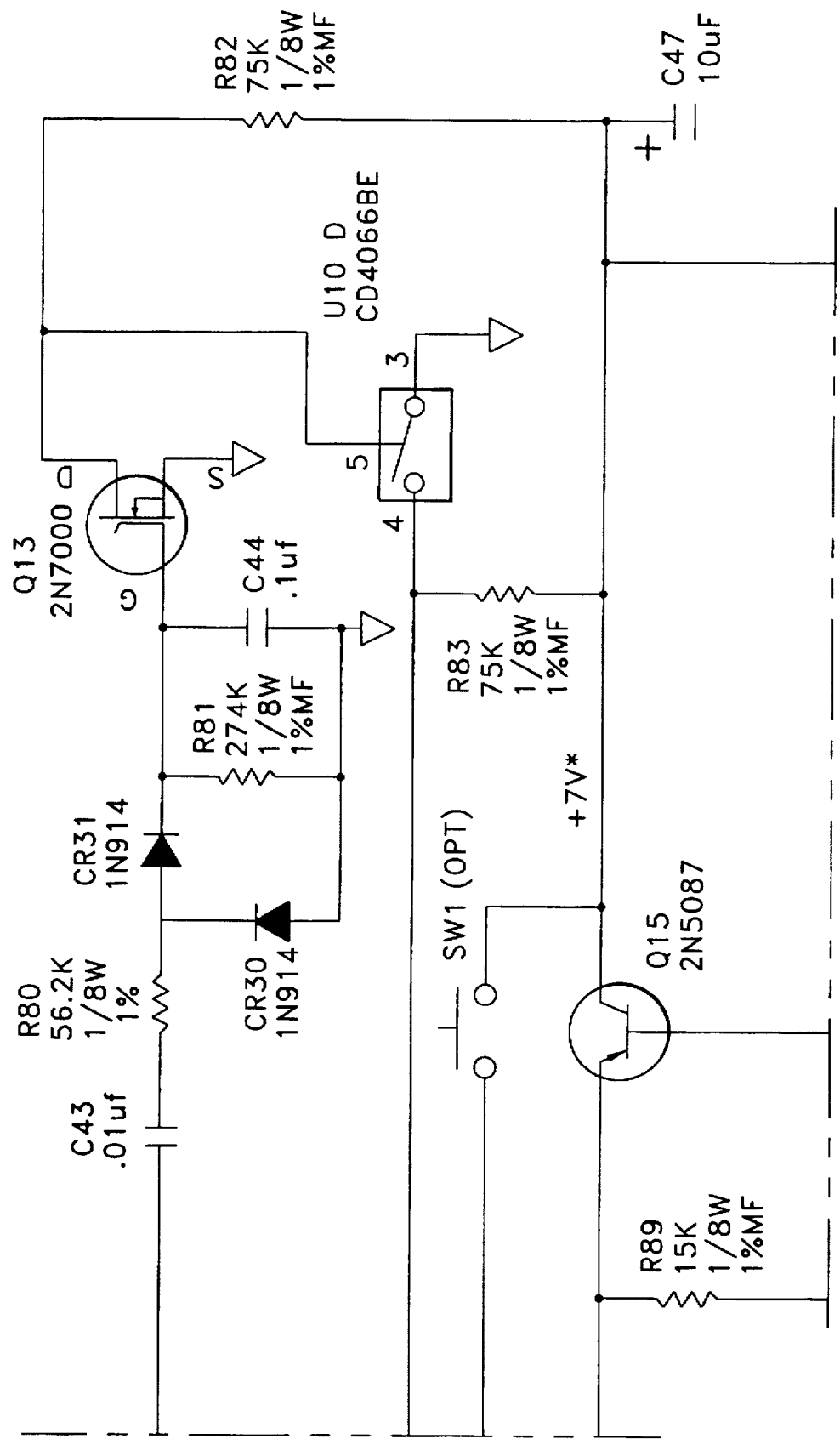
Figure 12G:
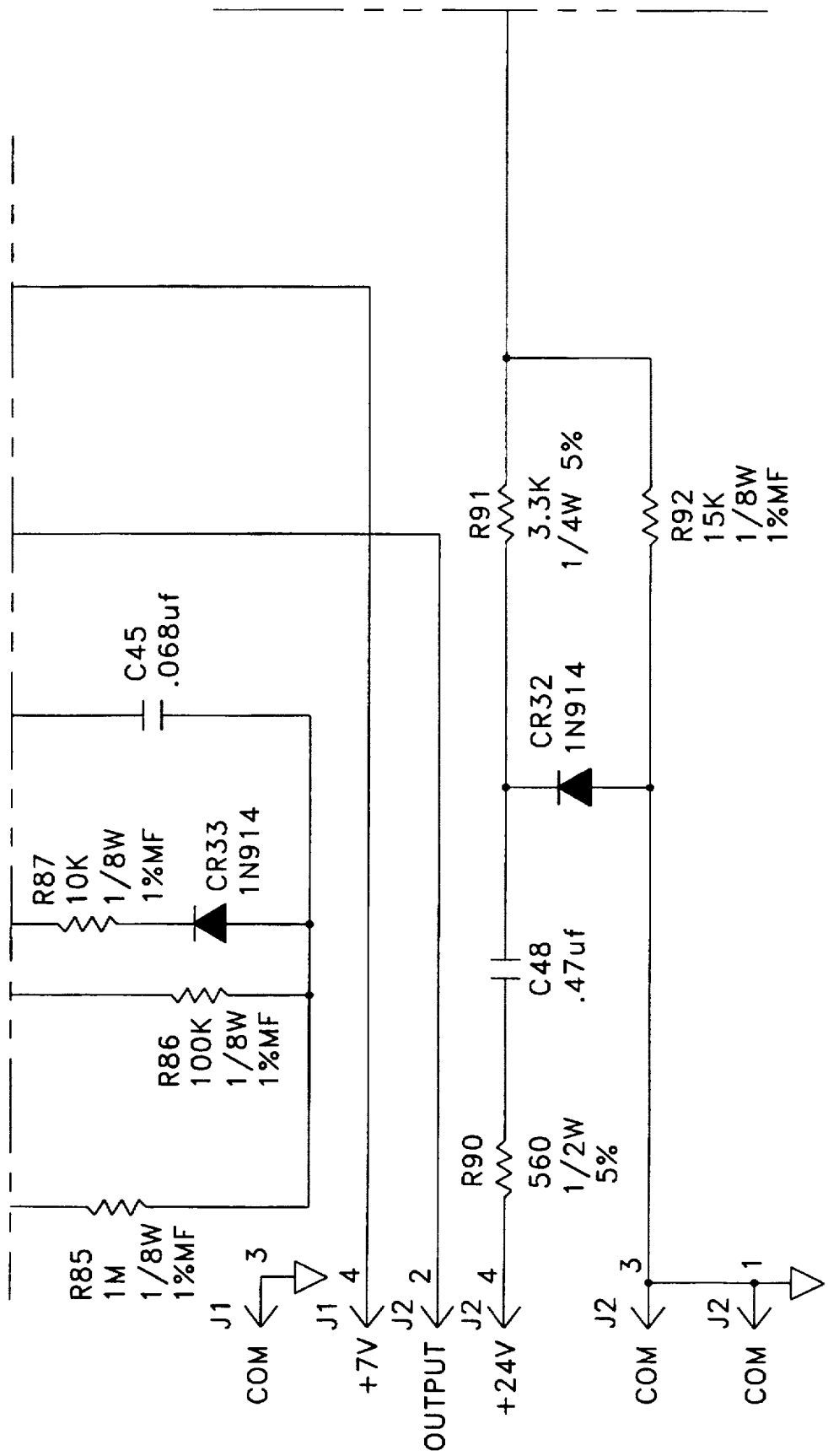
Figure 12H:
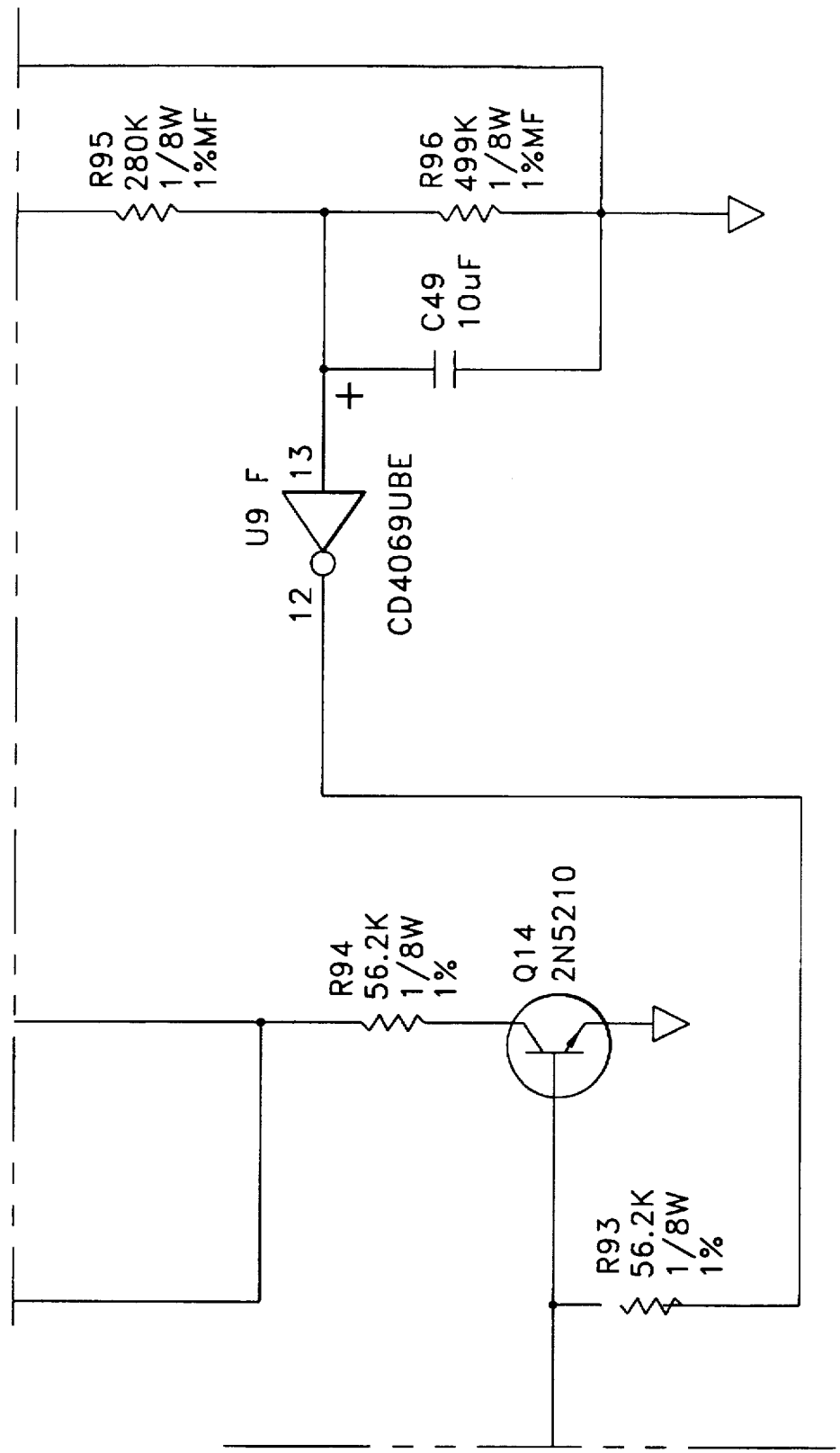

FIGS. 12a–12 b is a schematic diagram of a preferred embodiment of the instrument testing circuitry shown in FIG. 11. An oscillator comprising inverters U9D and U9E applies pulses through diodes CR34 and CR35 to the crystal 240a through the OUTPUT line. Detection of the effects of such pulses at the INPUT line from crystal 240b is effected by a three-stage amplifier circuit comprising U9A, U9B, and U9C and a peak detecting circuit comprising C43, C44, R80, R81, CR30, and CR31. Detected oscillations result in a high gate voltage which turns on transistor Q13, opening switch U10D, and closing the switch comprising U10A, B, and C coupled in series. The switch comprising U10A, B, and C corresponds to the switch 254 in FIG. 11. Closure of the switch interposes resistor R88 and capacitor C46 as feedback components between the OUTPUT and INPUT terminals as a part of the test; these correspond to feedback impedance 284 of FIG. 11. Use of series-connected electronic switches U10A, B, and C helps provide isolation across the switch to reduce spurious feedback when the circuit is not being tested. A test signal receiver comprising transistors Q14 and Q15 detects negative pulses on the +24 v signal wire to initiate a test. The positive edge of such a pulse turns on Q14 and Q15 to apply power to line +7 V*, which powers the remainder of the testing circuitry. The testing circuitry is powered and operative for a time controlled by R95, R96, and C49; when the voltage of the input of U9F crosses its switching threshold, it cuts off Q14 to depower the testing circuit.

Figure 13:
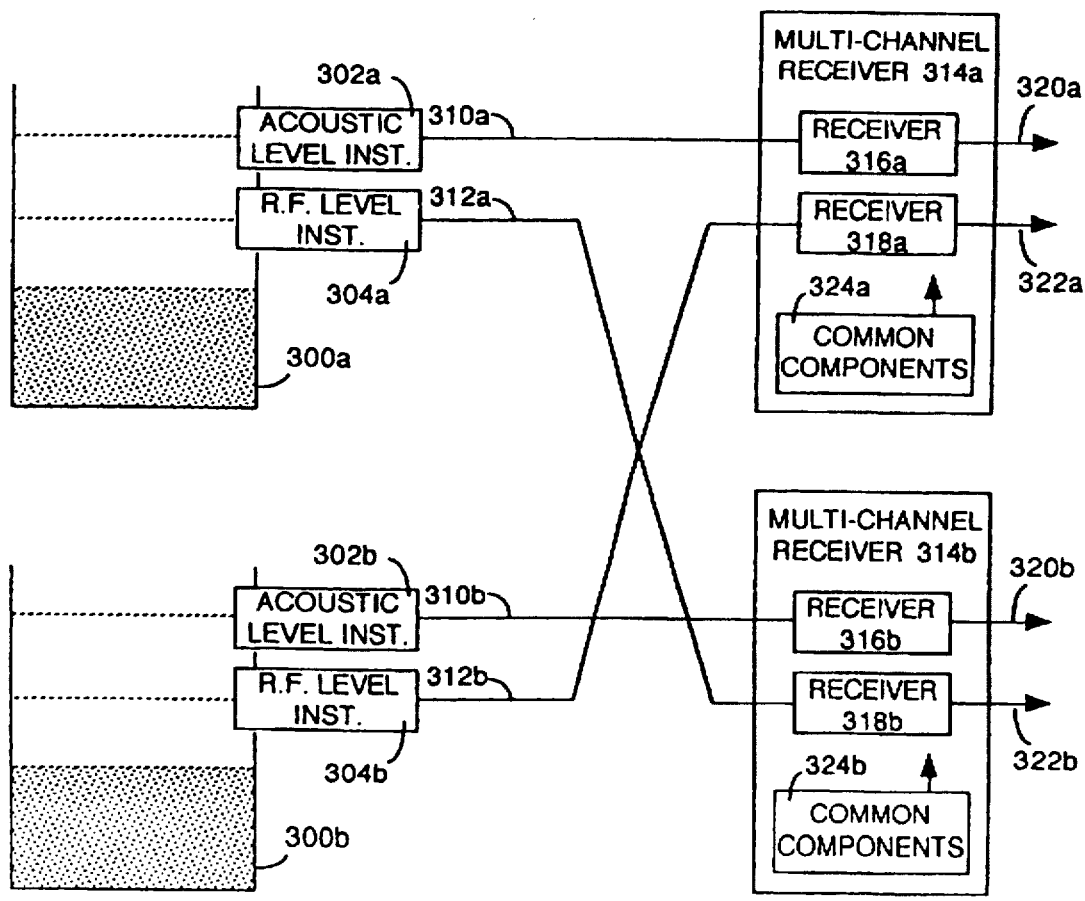
FIG. 13 is a block diagram of an instrument system including a plurality of multiple channel receivers.

FIG. 13 is a functional diagram illustrating a modification of the system of FIG. 9, which provides improved reliability when multiple-channel receivers are used. In many instrumentation applications, receiver systems are employed which are capable of receiving signals from a plurality of remotely mounted instruments. Such receiver systems may be economically advantageous for a variety of reasons, including the ability to share functional elements such as power supplies or signal processing computers among a number of instrument channels. Such multiple channels receivers may also provide increased convenience in installation and use. The diagram of FIG. 13 shows a preferred system for interconnecting redundant field instruments from each of a plurality of monitored locations to a plurality of multiple channel receivers. Although FIG. 13 illustrates a pair of vessels each with a pair of level measuring instruments, which are coupled to a pair of two-channel receivers, it will be understood that in general this method is applicable to other numbers of monitored locations, degrees of redundancy, types of measurement, and receiver capabilities.

The system of FIG. 13 includes a pair of vessels 300a and 300b, each of which has a quasi-redundant overfill protection system including an acoustic instrument 302a, b, and an RF instrument 304a, b. The output signals from each instrument are communicated over four communication channels 310a, b, and 312a, b to a pair of multiple channel receivers 314a and 314b. Each multiple channel receiver includes a pair of receivers, e.g. 316a and 318a, each of which includes circuitry for receiving signals from a single field instrument, processing the received signals, and generating an appropriate output related to the received signals. Each of the multiple channel receivers includes common functional elements or components, as illustrated by blocks 324a and b, which provide functions that are common to or shared among each of the receivers in the multiple channel receiver. For instance, 324a may represent a common source of power, a common power supply circuit, a common signal processing computer, or even a common housing. The commonality which is important is that a defect or failure in the common component is likely to affect all of the receivers with which it is associated.

For most purposes, the most desirable way to interconnect each of the multiple channels receivers with a pair of instruments would be connect the instruments from one vessel, for instance vessel 300a, to the receivers of one multiple channel receiver, for instance multiple channel receiver 314a. This minimizes wiring costs and complexity and maximizes convenience, particularly in view of the fact that vessel 300a may be located a great distance from vessel 300b and a similar situation may exist with regard to the receivers. However, in accordance with the invention, the instruments and receivers are interconnected so that the redundant or quasi-redundant instruments monitoring a particular vessel or any particular physical condition are not all connected to the same multiple channel receiver. Thus, as shown, the acoustic instrument 302a is connected to a receiver in multiple channel receiver 314a, but radio frequency instrument 304a which monitors the same vessel is connected to a receiver in multiple channel receiver 314b. The instruments monitoring vessel 300b are interconnected with receivers in a similar manner. In the event of a defect or failure in any of the common components of one multiple channel receiver, no vessel is left without some overfill detection capability. The interconnection system of FIG. 13 thus improves the overall reliability of the entire instrumentation system.

While particular embodiments of the invention have been described in detail, it will be understood that various modifications may be made by those skilled in the art without departing from the spirit and scope of the invention.

What is claimed is:

1. A gap-type acoustic instrument having a sensor having first and second piezoelectric crystals mounted in a support structure adjacent a gap in the support structure which may be filled with a material to be monitored, and having test apparatus comprising:

a test signal generator coupled to said first crystal;

a detector coupled to said second crystal, said detector producing an output which is responsive to alternating signals generated in said second crystal in response to test signals applied by said test signal generator to said first crystal;

an amplifier having an amplifier input coupled to one of said crystals and an amplifier output coupled to the other of said crystals; and a controlled amplifier feedback element coupled to said detector and to said amplifier, said feedback element providing feedback to said amplifier which is responsive to the detector output.

2. The instrument of claim 1, wherein said feedback element has a feedback value corresponding to the feedback provided to said amplifier by the presence of a predetermined material in said sensor gap.

3. The instrument of claim 1, wherein said test signal generator is a pulse generator.

4. A method of testing the operability of a gap-type acoustic instrument having a sensor having first and second piezoelectric crystals mounted in a support structure adjacent a gap in the support structure which may be filled with a material to be monitored and having an electronic circuit coupled to said crystals, comprising the steps of:

performing a sensor integrity test to determine whether the crystals are properly coupled to said support structure and to said electronic circuit, said sensor integrity test includes applying a test signal to said first crystal and detecting responsive signals generated by said second crystal; and if said sensor integrity test is passed, testing the operability of the electronic circuit, wherein said electronic circuit includes an amplifier coupled to said crystals, and said electronic circuit testing step includes applying feedback to the amplifier in response to detected alternating signals so as to induce amplifier oscillation.

5. The method of claim 4, wherein said test signal applying step includes applying a pulse to said first crystal.

6. The method of claim 4, wherein said feedback is selected in accordance with feedback provided by predetermined sensor conditions.

* * * * *

UNITED STATES PATENT AND TRADEMARK OFFICE
CERTIFICATE OF CORRECTION

PATENT NO. : 5,777,550                                   Page 1 of 2
DATED       : July 7, 1998
INVENTOR(S) : Maltby, et al It is certified that error appears in the above-identified patent and that said Letters Patent are hereby corrected as shown below:

Column 5, line 38: Delete "FIG. 7" and substitute -- FIGS. 7a-7h -- therefor.

Column 5, line 40: Delete "FIG. 8a-8d the" and substitute -- FIGS. 8a-8h are -- therefor.

Column 10, line 67: Delete "7 is" and substitute -- 7a-7h are -- therefor.

Column 11, line 5: Delete "FIG. 8" and substitute -- FIGS. 8a-8h -- therefor.

Column 11, lines 48 & 49: Delete "8a and 8b" and substitute -- 8a-8d -- therefor.

Column 11, line 50: Delete "side-by-side" and substitute -- as shown in the legend on FIG. 8a -- therefor.

Column 11, line 51: Delete "as" ; delete " may 8c and 8d" and substitute -- FIGS. 8e-8h may be placed as shown in the legend on FIG. 8e to show their interconnections -- therefor.

Column 11, line 52: Delete "8a, b" and substitute -- 8a-8d -- therefor.
            Delete 8c, d" and substitute -- 8e-8h -- therefor.

Column 12, line 48: Delete "FIG. 8a" and substitute -- FIGS. 8a-8d -- therefor.

Column 12, line 56: Delete "8c" and substitute -- 8g -- therefor.

UNITED STATES PATENT AND TRADEMARK OFFICE
CERTIFICATE OF CORRECTION

PATENT NO. : 5,777,550
DATED : July 7, 1998
INVENTOR(S) : Maltby, et al

It is certified that error appears in the above-identified patent and that said Letters Patent is hereby corrected as shown below:

Column 16, line 63: Delete "FIGS. 12a-12b" and substitute — FIGS. 12a-12h — therefor.

Signed and Sealed this

Third Day of April, 2001

*Attest:*

NICHOLAS P. GODICI

*Attesting Officer*      *Acting Director of the United States Patent and Trademark Office*